(12) United States Patent
Friedrich et al.

(10) Patent No.: US 9,081,041 B2
(45) Date of Patent: Jul. 14, 2015

(54) HIGH ACCURACY DIFFERENTIAL CURRENT SENSOR FOR APPLICATIONS LIKE GROUND FAULT INTERRUPTERS

(75) Inventors: Andreas P. Friedrich, Metz-Tessy (FR); Andrea Foletto, Annecy (FR); P. Karl Scheller, Bow, NH (US); William P. Taylor, Amherst, NH (US); Michael C. Doogue, Manchester, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 211 days.

(21) Appl. No.: 13/439,094

(22) Filed: Apr. 4, 2012

(65) Prior Publication Data

US 2013/0265041 A1 Oct. 10, 2013

(51) Int. Cl.
*G01R 33/02* (2006.01)
*G01R 15/20* (2006.01)

(52) U.S. Cl.
CPC .................................. *G01R 15/207* (2013.01)

(58) Field of Classification Search
CPC ....... G01R 33/02; B61K 9/10; G01N 27/9033
USPC ........... 324/260, 207, 144, 210, 248; 257/425
See application file for complete search history.

(56) References Cited

U.S. PATENT DOCUMENTS

| | | | | |
|---|---|---|---|---|
| 4,101,829 A | * | 7/1978 | Gomperts et al. | 324/126 |
| 4,602,212 A | * | 7/1986 | Hiroshima et al. | 324/227 |
| 5,442,221 A | * | 8/1995 | Mosser et al. | 257/425 |
| 6,040,690 A | * | 3/2000 | Ladds | 324/142 |
| 6,291,907 B1 | * | 9/2001 | Haigh et al. | 307/91 |
| 6,310,470 B1 | * | 10/2001 | Hebing et al. | 324/117 R |
| 6,509,732 B1 | | 1/2003 | Rhodes et al. | |
| 6,762,897 B1 | | 7/2004 | Kabashima et al. | |
| 7,166,807 B2 | | 1/2007 | Gagnon et al. | |
| 7,476,816 B2 | | 1/2009 | Doogue et al. | |

(Continued)

FOREIGN PATENT DOCUMENTS

WO WO 2008/145600 A1 12/2008

OTHER PUBLICATIONS

Maria Gabriella Masi, Lorenzo Peretto, Roberto Tinarelli, A Self-Shielded Current Transducer for Power System Application, IEEE, 2011, pp. 1-5.

(Continued)

*Primary Examiner* — Arleen M Vazquez
*Assistant Examiner* — Dominic Hawkins
(74) *Attorney, Agent, or Firm* — Daly, Crowley, Mofford & Durkee, LLP

(57) ABSTRACT

A sensor with multiple magnetic field sensing elements for use in current sensing and other applications is presented. In one configuration, the sensor can obtain differential and absolute current measurements of current in current-carrying conductors. When employed in a ground fault interrupter (GFI) application, a first magnetic field sensing element can be used to measure the absolute current flowing in the phase conductor (phase current), a second magnetic field sensing element can be used to measure the absolute current flowing in the neutral conductor (neutral current) and a difference between the phase and neutral currents can be measured by a third magnetic field sensing element or determined from measurements of the first and second magnetic field sensing elements. In another configuration, the sensor can obtain a measure of the difference between currents and/or the sum of currents in current-carrying conductors.

51 Claims, 17 Drawing Sheets

(56) References Cited

U.S. PATENT DOCUMENTS

| | | | |
|---|---|---|---|
| 7,492,149 B2 | 2/2009 | Motz et al. | |
| 7,714,570 B2 | 5/2010 | Thomas et al. | |
| 7,759,929 B2 | 7/2010 | Forsyth | |
| 7,911,203 B2 | 3/2011 | Thomas et al. | |
| 7,994,774 B2 | 8/2011 | Thomas et al. | |
| 8,125,216 B2 | 2/2012 | Thomas et al. | |
| 2005/0073293 A1 | 4/2005 | Hastings et al. | |
| 2005/0156587 A1* | 7/2005 | Yakymyshyn et al. | 324/117 R |
| 2005/0275399 A1 | 12/2005 | Kitanaka et al. | |
| 2006/0213952 A1* | 9/2006 | Johansen | 228/1.1 |
| 2007/0200564 A1* | 8/2007 | Motz et al. | 324/247 |
| 2008/0042644 A1 | 2/2008 | Heo et al. | |
| 2008/0297158 A1 | 12/2008 | Heger et al. | |
| 2009/0168280 A1* | 7/2009 | Huang et al. | 361/56 |
| 2009/0174395 A1 | 7/2009 | Thomas et al. | |
| 2009/0243606 A1* | 10/2009 | Riedmuller | 324/244 |
| 2009/0315555 A1* | 12/2009 | Heger | 324/260 |
| 2010/0007340 A1* | 1/2010 | Kaita et al. | 324/207.25 |
| 2010/0156394 A1* | 6/2010 | Ausserlechner et al. | 324/144 |
| 2010/0156397 A1* | 6/2010 | Yabusaki et al. | 324/207.2 |
| 2010/0211347 A1 | 8/2010 | Friedrich et al. | |
| 2011/0043197 A1 | 2/2011 | Trontelj | |
| 2011/0057649 A1* | 3/2011 | Yoshida et al. | 324/210 |
| 2011/0216452 A1* | 9/2011 | Haines et al. | 361/42 |
| 2011/0221429 A1* | 9/2011 | Tamura | 324/244 |
| 2011/0316561 A1 | 12/2011 | Tinsley et al. | |
| 2012/0098527 A1 | 4/2012 | Ely | |
| 2012/0126805 A1 | 5/2012 | Ausserlechner et al. | |
| 2012/0187943 A1* | 7/2012 | Ausserlechner et al. | 324/244 |
| 2012/0194175 A1 | 8/2012 | Ausserlechner | |
| 2012/0194945 A1* | 8/2012 | Gao | 360/77.03 |
| 2012/0229131 A1* | 9/2012 | Takenaga et al. | 324/249 |
| 2013/0002857 A1 | 1/2013 | Kulik | |
| 2013/0015843 A1 | 1/2013 | Doogue et al. | |
| 2013/0020660 A1 | 1/2013 | Milano et al. | |
| 2013/0265036 A1 | 10/2013 | Friedrich et al. | |
| 2013/0265037 A1 | 10/2013 | Friedrich et al. | |

OTHER PUBLICATIONS

Notification Concerning Transmittal of Copy of International Preliminary Report on Patentability (Chapter I of the Patent Cooperation Treaty) dated Jul. 1, 2013, PCT/US2013/033248, 1 page.

International Search Report dated Jul. 1, 2013, PCT/US2013/033248, 4 pages.

Written Opinion of the International Searching Authority, PCT/US2013/033248 Jul. 1, 2013, 6 pages.

Friedrich et al., U.S. Appl. No. 13/078,200, Entitled "Differential Magnetic Field Sensor Structure for Orientation Independent Measurement" filed Apr. 1, 2011, 64 Pages.

Friedrich et al., U.S. Appl. No. 13/439,082, Entitled "Angle Sensor With Misalignment Detection and Correction" filed Apr. 4, 2012, 62 Pages.

Friedrich et al., U.S. Appl. No. 13/439,074, Entitled "Magnetic Field Sensor Having Multiple Sensing Elements for Misalignment Detection and Correction in Current Sensing and Other Applications" filed Apr. 4, 2012, 62 Pages.

Allegro Datasheet ACS710, 120 kHz Bandwidth, High Voltage Isolation Current Sensor with Integrated Overcurrent Detection, 2007-2009, 15 pages.

Allegro Datasheet ACS761ELF-20B, 12V High-Side Hot-Swap Hall Effect Based Current Monitor IC, 2008-2009, 14 pages.

Office Action dated Feb. 13, 2014 for U.S. Appl. No. 13/439,082, filed Apr. 4, 2012, 25 pages.

Office Action dated Mar. 3, 2014 for U.S. Appl. No. 13/439,074, filed Apr. 4, 2012, 15 pages.

Response filed Mar. 31, 2014 to Office Action dated Mar. 3, 2013 for U.S. Appl. No. 13/439,074, filed Apr. 4, 2012, 10 pages.

Office Action dated Jul. 9, 2014 for U.S. Appl. No. 13/439,074, 14 pages.

Response to Office Action dated Feb. 13, 2014, U.S. Appl. No. 13/439,082, filed Apr. 4, 2012, 15 pages.

International Preliminary Report on Patentability dated Oct. 16, 2014 for PCT App. No. PCT/US2013/033248; 6 pages.

Maria Gabriella Masi et al: "A Self-Shielded Current Transducer for Power System Application", Applied Measurements for Power Systems (Amps), 2011 IEEE International Workshop on, IEEE, Sep. 28, 2011, pp. 43-47, DOI:10.1109/AMPS.2011.6090432, ISBN: 1-61284-946-1.

Office Action dated Jul. 9, 2014 for U.S. Appl. No. 13/439,074; 14 pages.

Response to Office Action filed on Aug. 19, 2014 for U.S. Appl. No. 13/439,074; 12 pages.

Notice of Allowance dated Sep. 15, 2014 for U.S. Appl. No. 13/439,074; 7 pages.

Response to Office Action filed on May 5, 2014 for U.S. Appl. No. 13/439,082; 13 pages.

Office Action dated Oct. 8, 2014 for U.S. Appl. No. 13/439,082; 24 pages.

Response to Office Action filed Dec. 5, 2014 for U.S. Appl. No. 13/439,082; 12 pages.

Notice of Allowance dated Feb. 5, 2015 for U.S. Appl. No. 13/439,082; 9 pages.

Response to Office Action filed May 7, 2015 for European Application No. 13713708.9, 26 pages.

* cited by examiner

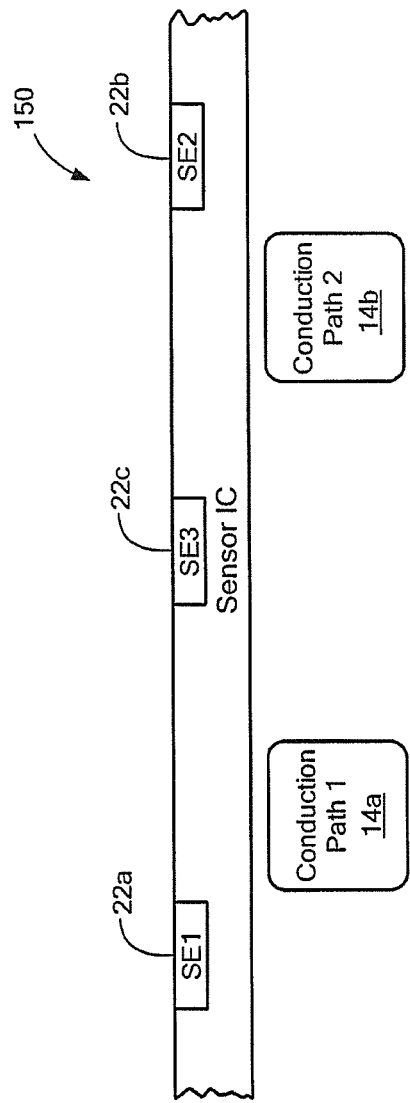
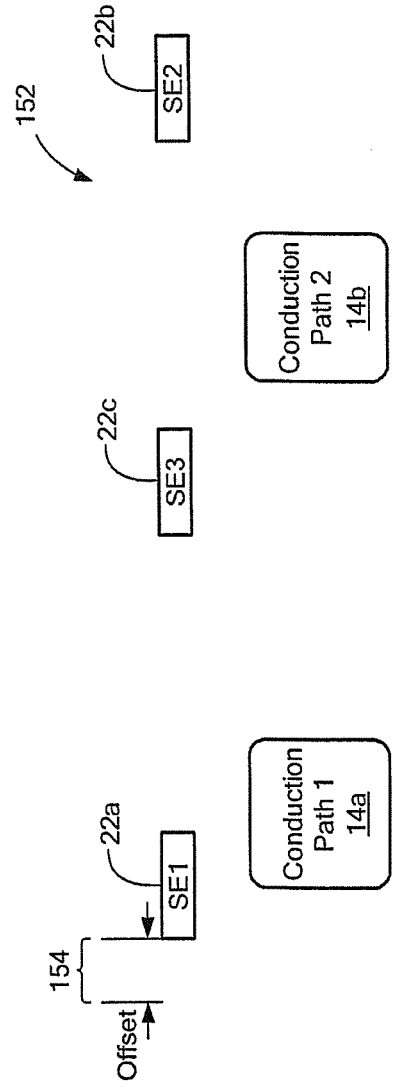
FIG. 5A
FIG. 5B

HIGH ACCURACY DIFFERENTIAL CURRENT SENSOR FOR APPLICATIONS LIKE GROUND FAULT INTERRUPTERS

CROSS-REFERENCE TO RELATED APPLICATIONS

Not applicable.

STATEMENT REGARDING FEDERALLY SPONSORED RESEARCH

Not applicable.

FIELD OF THE INVENTION

This invention relates generally to high accuracy differential current sensors and to high accuracy differential current sensors disposed on a single integrated circuit.

BACKGROUND

Current measurement circuits are employed in a variety of different applications, for example, power monitoring, power consumption management, motor control, diagnostics and fault detection. Technologies that are typically used in current measurement circuits to measure current in a current-carrying conductor include sense resistors, magnetic field sensors (such as Hall-effect sensors) and current transformers.

In fault detection applications, a current measurement circuit can monitor current flow for fault conditions, e.g., by measuring current in the path from power source to load, the return path (from load to power source) or the differential between current levels in the two paths. One type of fault detection that uses differential current measurement is the ground fault interrupter (GFI). The GFI is a device designed to prevent electrical shock by detecting potentially hazardous ground faults. The GFI, when installed in a circuit, compares the amount of current in the phase (ungrounded or "hot") conductor with the amount of current in the neutral conductor in the circuit. When a circuit is operating normally, equal current flows from the power source to the load through the phase conductor and returns through the neutral conductor. The GFI device interrupts the circuit (that is, disconnects power from the circuit) when it detects a small current difference in the phase and neutral conductors. Such a difference (typically in the range of 1 mA to 30 mA) indicates that an abnormal diversion of current from the phase conductor is occurring, e.g., as would be the case when someone touches the phase conductor. As a result, an amount of current ("ground fault current") is returned by some path other than the intended neutral conductor.

GFI protection is required by electrical code for many household circuits, such as receptacles in bathrooms, some kitchen receptacles, some outside receptacles, and receptacles near swimming pools. To date, GFI devices have been designed to use a differential current transformer, which surrounds both the phase and the neutral conductors, to detect imbalances in the flow of current in those conductors. Such a solution tends to be bulky and expensive.

SUMMARY

In general, in one aspect, the invention is directed to a differential current sensor. The differential current sensor has magnetic field sensing elements including a first sensing element to sense a magnetic field associated with a first current carried by a first current conduction path and a second sensing element to sense a magnetic field associated with a second current carried by a second current conduction path. The differential current sensor also includes circuitry, coupled to the magnetic field sensing elements, to provide an output signal comprising a difference signal indicative of a difference between a magnitude of the first current and a magnitude of the second current.

Embodiments of the invention may include one or more of the following features. The circuitry can operate to generate first and second signals based on the sensed first and second magnetic fields, respectively, and use the first and second signals to produce the difference signal. The circuitry can further operate to provide a total current output signal based on a sum of the first and second signals and indicative of a total of the magnitude of the first current and the magnitude of the second current. The magnetic field sensing elements can include a third sensing element located between the first sensing element and the second element to sense the magnetic fields associated with the first and second currents and the circuitry can further operate to generate a third signal based on sensing by the third sensing element and to use the third signal to produce the difference signal. In addition to generating the difference signal from the third signal, the circuitry can further operate to provide an output signal based on the first signal and indicative of the magnitude of the first current and to provide an output signal based on the second signal and indicative of the magnitude of the second current. Alternatively, the circuitry can further operate to provide a total current output signal based on a sum of the first and second signals and indicative of a total of the magnitude of the first current and the magnitude of the second current.

The first and second sensing elements can be made of a first semiconductor material and the third sensing element can be made of a second semiconductor material more magnetically sensitive than the first semiconductor material. The first semiconductor material can be Silicon and the second semiconductor material can be a selected one of Germanium, Gallium Arsenide or other high mobility compound semiconductor material. Alternatively, all of the sensing elements can be made of the same semiconductor material. Each sensing element can be a selected one of a Hall-effect sensing element and a magnetoresistive sensing element.

The differential current sensor can also include a programmable misalignment adjustment block to electronically compensate the difference signal for misalignment between the magnetic field sensing elements and the first and second current conduction paths. The programmable misalignment adjustment block can be programmed to add an offset value to the third signal when a test of the differential current sensor indicates a misalignment. Instead of using a single middle sensing element (that is, the third sensing element), an arrangement of one or more additional sensing elements located between the first and second sensing elements can be included to sense both of the first and second magnetic fields. The programmable misalignment block can be programmed to control the circuitry to produce the difference signal based on a mathematical combination of measurements of the one or more additional sensing elements.

The differential current sensor can also include a coil driver and interface logic to interface the circuitry to the coil driver, the interface logic to receive the difference signal from the circuitry and generate an input signal to the coil driver and the coil driver, in response to the input signal, to provide a drive signal to drive a coil of an external trip circuit.

Unlike conventional GFI circuits, which measure only the difference between the currents flowing in the phase and neutral conductors, the solution presented herein provides a sensor device with internal magnetic field sensing to measure the current difference between the two conductors as well as to measure the absolute current flowing in the two conductors. Also, the conventional GFI circuit uses a bulky differential current transformer, a through-hole solution that requires a cost-intensive passing of both phase and neutral wires through the differential current transformer. Such circuits contribute to high component and assembly costs. In contrast, the sensor device with magnetic field sensing elements described herein provides an integrated low-cost solution that allows for module cost optimization. The sensor device can be packaged in a small footprint, low profile surface mount package, allowing for miniaturization and easier assembly of a GFI module, as the phase and neutral conductor wires can be directly connected to the package pins. An integrated circuit (IC) approach to the design of the sensor device allows for easy integration of additional functionality, for example, a coil driver to actuate a trip coil.

Although the device is ideal for differential current sensing, particularly in GFI circuit applications, it also has the potential to be used as a redundant current sensor, redundant linear position sensor or 360 degree angle sensor. Also, compensation for mechanical misalignment can be made possible during device testing or calibration through the inclusion of programmable on-chip features. The programmable on-chip features can be used to select the most accurate difference measurement by selecting measurements of particular sensing elements or mathematical combinations of such measurements, or applying an offset parameter to the difference measurement.

BRIEF DESCRIPTION OF THE DRAWINGS

The foregoing features of the invention, as well as the invention itself may be more fully understood from the following detailed description of the drawings, in which:

FIGS. 5A-5E are diagrams illustrating different approaches to potential misalignment of sensing elements relative to current conductors;

FIGS. 7A-7B are diagrams illustrating an exemplary angle sensor application in which a sensor IC like that shown in FIGS. 1A-1B and FIG. 2A is employed;

DETAILED DESCRIPTION

Figure 1A:
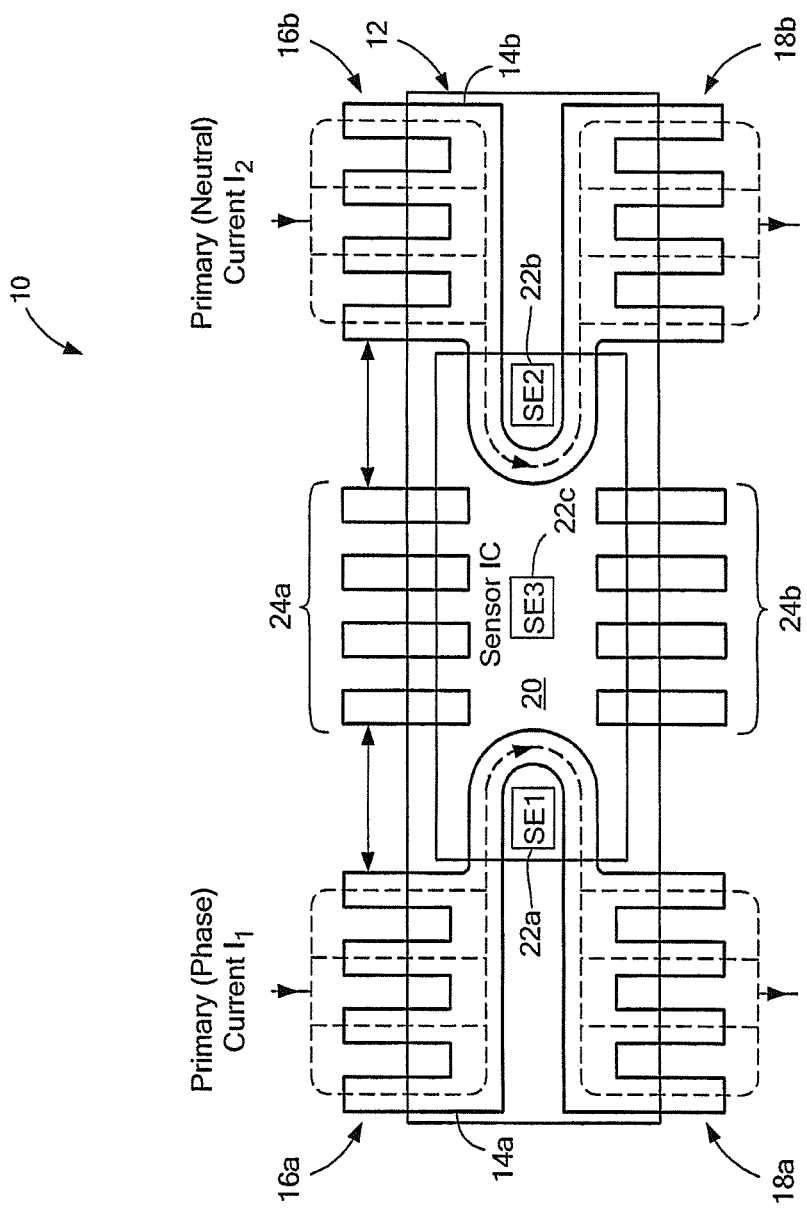
FIG. 1A is top view of a structure of an exemplary differential current sensor.

Referring to FIG. 1A, a differential current sensor 10 that includes at least one independent sensing element for measuring small differences between two incoming currents of similar amplitudes is shown. The sensor 10 includes a first structure 12 that is provided with a first conduction path 14a and a second conduction path 14b. The first conduction path 14a has input terminals 16a and output terminals 18a. The second conduction path 14b has input terminals 16b and output terminals 18b. A primary current $I_1$ of a first external conductor or bus can be provided to the input terminals 16a, flow through the conduction path 14a and exit the output terminals 18a. Likewise, a primary current $I_2$ of a second external conductor or bus can be applied to the input terminals 16b, flow through the conduction path 14b and exit the output terminals 18b.

The sensor 10 further includes a second structure (or device) 20 to measure the primary currents $I_1$ and $I_2$. The device 20 includes at least one magnetic field sensing element (also referred to as magnetic field transducer). In the illustrated embodiment, the device 20 includes three magnetic field sensing elements SE1 22a, SE2 22b and SE3 22c (generally denoted 22). The element SE1 22a is used to measure the primary current $I_1$ and the element SE2 22b is used to measure the primary current $I_2$. In a three sensing element implementation, such as that shown in FIG. 1A, the element SE3 22c is used to measure the current difference between $I_1$ and $I_2$.

In one embodiment, as shown, the device 20 is implemented as a sensor integrated circuit (IC). There are a number of pins or terminals, indicated by reference numerals 24a, 24b, to correspond to the IC inputs, outputs, supply and ground connections on opposing sides of the IC, respectively, as well. Pins may be provided on only one side of the IC in an alternative pin layout.

The first structure 12 may be implemented as a printed circuit (PC) board. In a PC board implementation, the conduction paths 14a, 14b would be provided with the PC board traces. The sensor IC 20 would be coupled to or positioned relative to the PC board so that the internal sensing elements 22a-22c are in close proximity to the conduction paths 14a and 14b. Alternatively, the first structure 12 could be implemented as a package that encloses the sensor IC 20 with the conduction paths 14a, 14b. A flip chip style assembly may be used to position the die over PC board traces or within a package. Packaging options can include surface mounted or through-hole type packages.

The first structure 12, when implemented with a package to enclose the sensor IC 20 with the conduction paths 14a, 14b, can be constructed according to known techniques, for example, those described in U.S. Pat. No. 7,166,807 and U.S.

Pat. No. 7,476,816, both entitled "Current Sensor" and assigned to Allegro Microsystems, Inc., the assignee of the subject application. Other techniques may be used as well. In particular, the first structure 12 should be designed to include an appropriate insulator between the conduction paths 14a, 14b and the sensor IC 20. Such insulation should provide the safety isolation required by target applications such as ground fault interrupter (GFI) applications. Examples of insulation structures and techniques may be had with reference to above-mentioned U.S. Pat. No. 7,166,807 as well as U.S. patent application Ser. No. 13/188,739 entitled "Reinforced Isolation for Current Sensor with Magnetic Field Transducer," filed Jul. 22, 2011, and assigned to Allegro Microsystems, Inc., the assignee of the subject application.

For GFI applications, the current $I_1$ corresponds to the phase current and the current $I_2$ the neutral current. When such an application is functioning normally, all the return current from an application load flows through the neutral conductor. The presence of a current difference between the phase and neutral currents would therefore indicate a malfunction. The detection of such a malfunction is critical, as it can result in a dangerous or even lethal shock hazard in some circumstances.

The magnetic field sensing elements SE1 22a, SE2 22b and SE3 22c can be based on Hall-effect technology and monolithically integrated into a Silicon (Si) IC. In order to measure small current differences, e.g., in the range of approximately 1 mA to 30 mA, the magnetic field sensing element SE3 22c needs to be very sensitive. Since the nominal primary currents $I_1$ and $I_2$ can be in the range of typically 1 A to 30 A (i.e., three orders of magnitude larger than the small current difference between $I_1$ and $I_2$), SE1 22a and SE2 22b can be made of conventional Si-Hall plates. In some embodiments, a magnetic field sensitive structure based on a different, more magnetically sensitive semiconductor material, e.g., Gallium Arsenide (GaAs) or Germanium (Ge), may be chosen for SE3 22c. Other high mobility compound semiconductor materials, e.g., Silicon Germanium (SiGe), Gallium Nitride (GaN), Indium compounds such as Indium Phosphide (InP), Indium Gallium Arsenide (InGaAs), Indium Gallium Arsenide Phosphide (InGaAsP), Indium Arsenide (InAs) and Indium Antimonide (InSb), and other materials, could be used as well. Different types of Hall-effect elements, for example, planar Hall elements, vertical Hall elements or circular vertical Hall (CVH) elements, can be used for the sensing elements 22.

The sensor IC can be any type of sensor and is therefore not limited to Hall-effect technology. Thus, the sensing elements 22 may take a form other than that of a Hall-effect element, such as a magnetoresistance (MR) element. An MR element may be made from any type of MR device, including, but not limited to: an anisotropic magnetoresistance (AMR) device; a giant magnetoresistance (GMR) device; a tunneling magnetoresistance (TMR) device; and a device made of a semiconductor material other than Silicon, such as GaAs or an Indium compound, e.g., InAs or InSb.

If a sensing element that does not respond to magnetic fields oriented perpendicular to the surface of the sensor IC 20 is utilized, the change in sensitivity axis of the sensing element may require that the sensing element be disposed at a different position relative to the current conductor(s). Such "re-positioning" would be apparent to one skilled in the art and is not discussed further here.

If the sensitivity of the sensing elements is large enough, the primary current conduction paths 14a, 14b may be implemented as PC board traces rather than being integrated into a package. In a configuration that utilizes PC board traces for the conduction paths, trimming may be required to optimize sensor accuracy. A PCB trace trimming or calibration (sensor or system-level calibration) may be used.

The current sensor 10 may be utilized in a current shunt configuration in which only a portion of the total current to be measured is applied to the conduction paths 14a, 14b and the remainder bypasses the current sensor 10. In one possible current shunt configuration, the shunt path or paths may be external, that is, they reside on the circuit board. For this type of shunt configuration, the sensor may be calibrated, for example, using a "self-calibration" technique as described in U.S. patent application Ser. No. 13/181,926 entitled "Current Sensor with Calibration for a Current Divider Configuration," filed Jul. 13, 2011 and assigned to Allegro Microsystems, Inc., the assignee of the subject application, or other calibration techniques. Alternatively, the shunt path or paths may be internal, that is, they may be part of the sensor package. An example of this type of internal (or "integrated") shunt is provided in the above-mentioned U.S. Pat. No. 7,476,816.

It will be appreciated that a current sensor like the differential current sensor 10 depicted in FIG. 1A could be used in a "current divider configuration" to measure a current that is larger (e.g., by a factor of 2×) than the nominal rating of $I_1$ and $I_2$. Such a current may be measured by physically splitting the current path between two subpaths, in this instance, using conduction paths 14a and 14b as the two subpaths. The differential current sensor 10 could also be useful for applications requiring redundancy, since the same current could be measured by more than one independent sensing element, e.g., SE1 22a and SE2 22b. In a current divider application, it will be appreciated that the terminals identified as input 16 and output 18 could be reversed on one conduction path so that both currents are applied to the conduction paths 14a, 14b in the opposite directions (instead of the same direction, as shown in FIG. 1A). In a current divider application, either the output of sensing element SE3 22c or a total sum of outputs of sensing element SE1 22a and sensing element SE2 22b could be used to determine the total current.

Figure 1B:
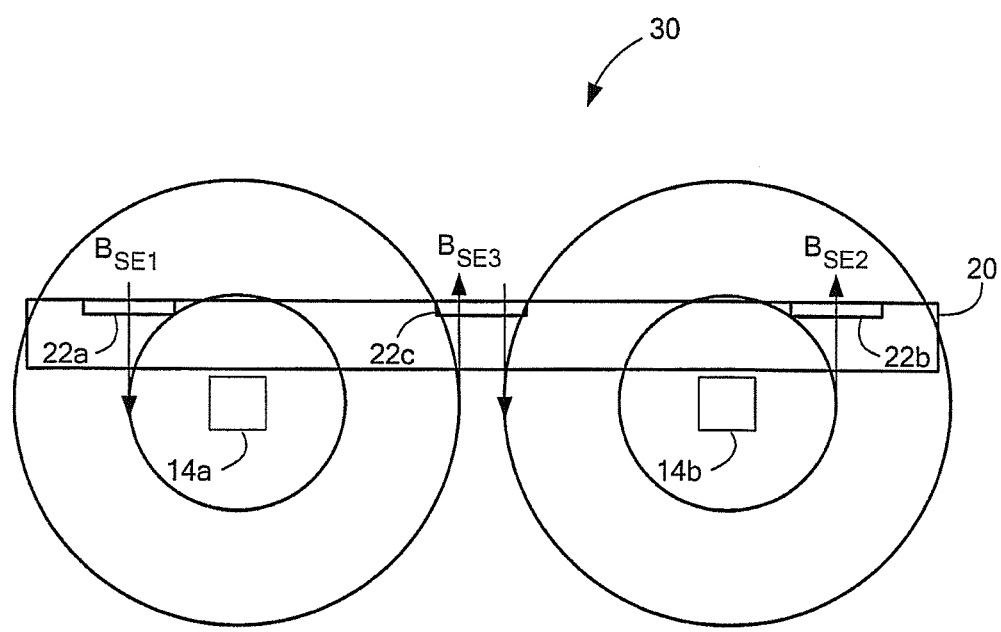
FIG. 1B is a partial side view of the structure shown in FIG. 1A.

FIG. 1B illustrates a partial side view of the structure 10 of FIG. 1A, indicated by reference numeral 30. This view shows the three sensing elements 22a-22c of the sensing IC 20, as well as the portion of conduction path 14a that passes near (and is sensed by) sensing elements 22a and 22c, along with the portion of conduction path 14b that passes near (and is sensed by) sensing elements 22b and 22c. Also shown in this view are the magnetic flux lines associated with the magnetic fields generated by the conduction paths 14a and 14b (assuming the direction of current flow points out of the plane of the drawing). More specifically, the magnetic field to be sensed by sensing element 22a and corresponding to conduction path 14a is represented by $B_{SE1}$, and the magnetic field to be sensed by sensing element 22b and corresponding to path 14b is represented by $B_{SE2}$. The magnetic field to be sensed by sensing element 22c and corresponding to conduction paths 14a and 14b is represented by $B_{sE3}$. The magnetic field $B_{sE3}$ includes magnetic field contributions from conduction paths 14a and 14b, which are of opposite polarity. It should be noted that sensing element 22a and sensing element 22b will 'see' a small magnetic field generated by conduction path 14b and conduction path 14a, respectively, as well.

FIGS. 2A-2D illustrate possible implementations of the sensing device (or IC) 20. The implementations depicted in FIGS. 2A and 2B utilize three sensing elements. The implementation depicted in FIG. 2C only requires the use of two sensing elements. The implementation depicted in FIG. 2D makes use of only one sensing element. Although the various architectures shown in FIGS. 2A-2D are described within the context of GFI current sensor applications, the architectures have application beyond GFI current sensors and other types of current sensors, as will be discussed later. For example, the architecture shown in FIG. 2A can also be used for position or displacement measurements, such as angular displacement measurement (as will be described with reference to FIGS. 7A-7B and 8A-8B).

Figure 2A:
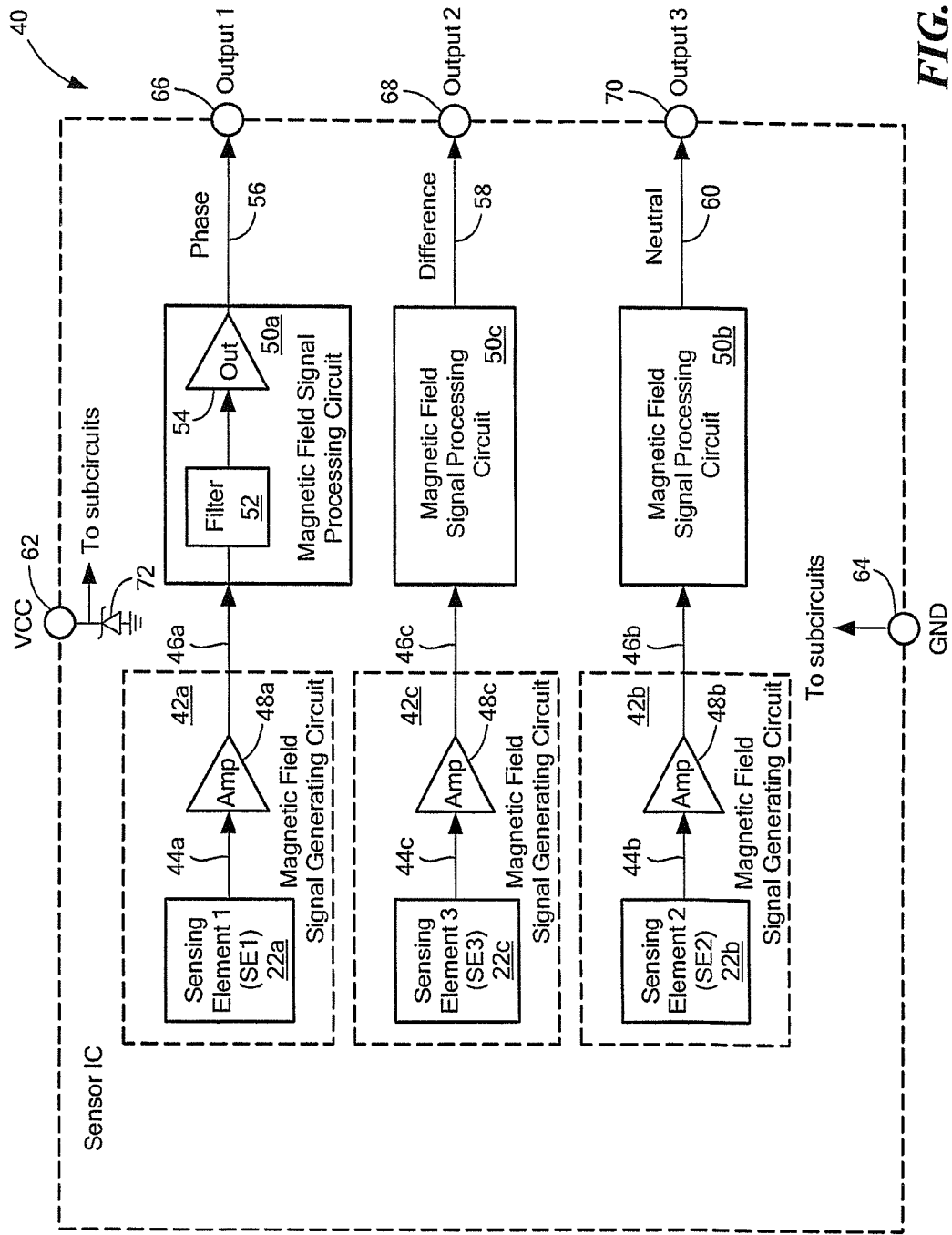
FIG. 2A is a block diagram of an example IC implementation for a sensor in which the amplitude of a phase current, the amplitude of a neutral current and the difference between the phase and neutral current amplitudes are available at the sensor output.

Turning first to FIG. 2A, an exemplary implementation of the sensor IC 20 (from FIGS. 1A-1B), shown here as current sensor IC 40, includes the three sensing elements 22a, 22b and 22c. The sensing elements 22a, 22b, 22c are part of magnetic field signal generating circuits 42a, 42b, 42c, respectively. The sensing elements 22a, 22b, 22c, sense magnetic fields associated with one or both of conduction paths 14a, 14b and produce respective sensing element output signals 44a, 44b, 44c, e.g., voltage signals, proportional to the sensed magnetic fields. The magnetic field signal generating circuits 42a, 42b, 42c may contain various conventional circuits that operate collectively to generate magnetic field signal generating circuit output signals (or magnetic field signals) 46a, 46b, 46c, respectively. Generally, in addition to the sensing element, each of the magnetic field signal generating circuits 42a, 42b and 42c includes at least an amplifier for amplifying the output signal of the sensing element 22a, 22b and 22c, respectively. Thus, magnetic field signal generating circuit 42a includes amplifier 48a to produce the magnetic field signal 46a, magnetic field signal generating circuit 42b includes amplifier 48b to produce the magnetic field signal 46b and magnetic field signal generating circuit 42c includes amplifier 48c to produce magnetic field signal 46c.

It will be understood that other circuitry may be included in the magnetic field signal generating circuits 42a-42c. For example, each circuit 42a-42c may include circuitry to implement dynamic offset cancellation. If the sensing elements 22a-22c are Hall plates, a chopper stabilization circuit can be provided to minimize the offset voltage of the Hall plates and associated amplifiers 48a-48c. Also, or alternatively, each circuit 42a-42c may implement an offset adjustment feature, by which the magnetic field signal is centered within the power supply range of the sensor and/or a gain adjustment feature, by which the gain of the magnetic field signal is adjusted to maximize the peak-to-peak within the power supply range without causing clipping.

Still referring to FIG. 2A, the sensor device or IC 40 also includes magnetic field signal processing circuits 50a, 50b, 50c. Although the internal details are only shown for circuit 50a, the circuits 50a-50c each includes a respective low-pass filter 52 and output amplifier/buffer 54, which process respective magnetic field signal 46a, 46b, 46c to produce respective magnetic field signal processing circuitry output signals 56, 60, 58. Output signals 56, and 60 are absolute measurement signals and output signal 58 is a measured difference measurement signal (or difference signal). In a GFI application, the output signal 56 and output signal 60 would be indicative of phase current magnitude and neutral current magnitude (as shown), respectively, and the difference signal 58 would be indicative of a difference between the phase and neutral current magnitudes.

The sensor device 40 may be provided in the form of an IC containing a semiconductor substrate on which the various circuit elements are formed. The IC would have at least one pin (terminal or lead) to correspond to each of: the VCC input or terminal 62 (to connect to an external power supply), GND terminal 64 (to connect to ground), and outputs including 'output 1' 66, 'output 2' 68 and 'output 3' 70. Outputs 66, 70, 68 enable an external differential current sensor application such as a GFI circuit or other application to receive and make use of any one or more of the output signals 56, 60, 58, respectively. Power is supplied to the IC 40 through the VCC pin 62, which is connected internally to the various subcircuits, as shown. A protection circuit, represented here as a simple Zener diode 72, is provided between the VCC pin 62 and ground for protection in the event that the supply pin is shorted to ground. The GND pin 64 is connected internally to provide a ground connection for subcircuits of the sensor. Other circuitry, such as control and clock generation, for example, has been eliminated from the figure for purposes of simplification.

Figure 2B:
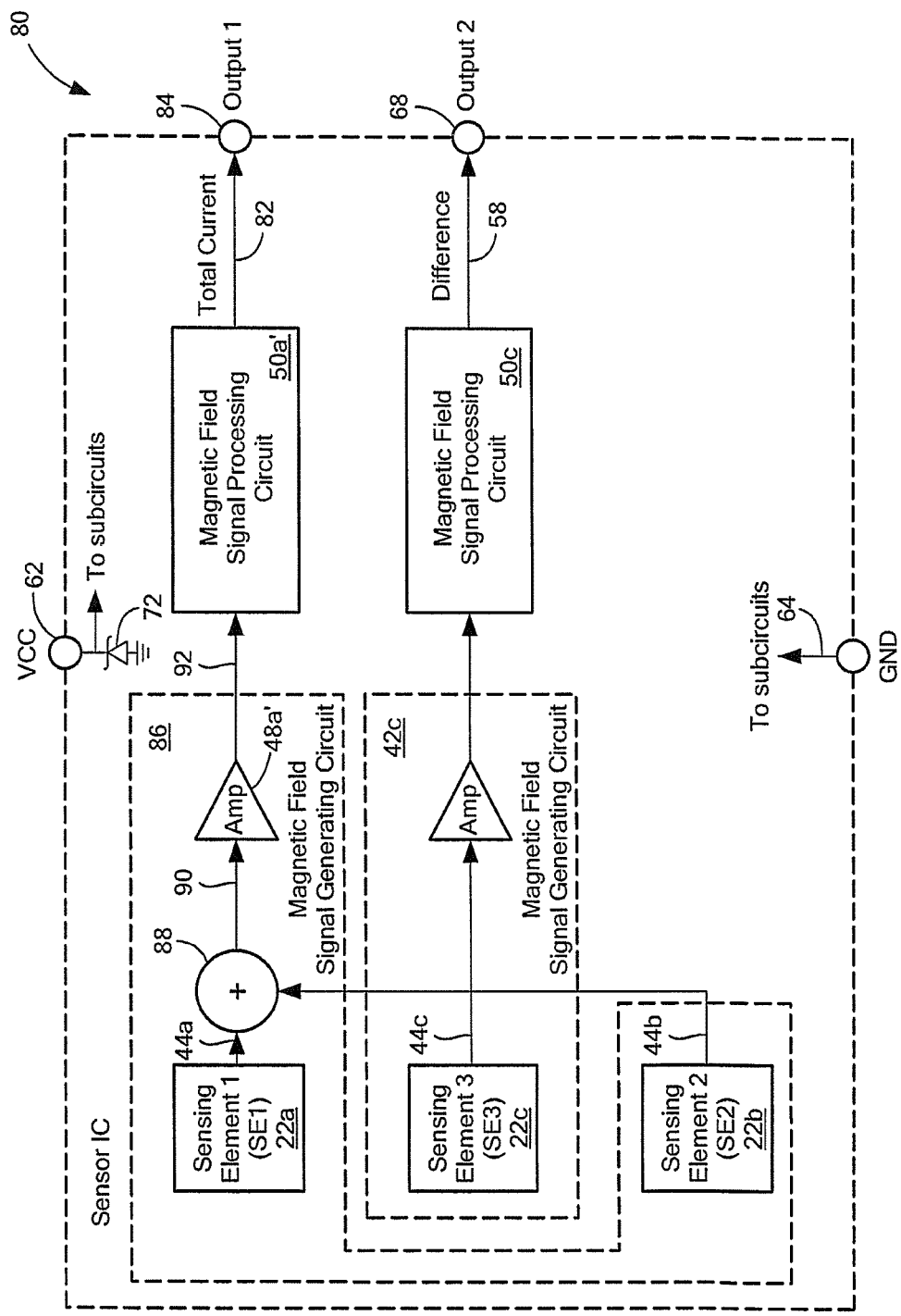
FIG. 2B is a block diagram of an example IC implementation for a sensor in which the total of the phase and neutral current amplitudes and the difference between the phase and neutral current amplitudes are available at the sensor output.

Now referring to FIG. 2B, in an alternative sensor device or IC 80, the three sensing elements 22a-22c are used to obtain the same measurements as device 40 from FIG. 2A. The device 80 differs from device 40 in that the device 80 provides a sum or total signal instead of signals corresponding to separate absolute measurements at its outputs. Thus, the device 80 includes only two signal paths, one to produce a total signal 82 at a "new" output 1 84 (which replaces outputs 66 and 70 on device 40). The device 80 includes a magnetic field signal generating circuit 86, which includes sensing elements 22a and 22b, as well as a summer element 88 to combine the sensing elements outputs 44a and 44b (from sensing elements 22a and 22b, respectively) to produce a total sensing element output 90. The circuit 86 also includes an amplifier, shown as amplifier 48a', which provides an output 92. The device 80 further includes a magnetic field signal processing circuit, shown as circuitry 50a', which processes the output 92 to produce the total signal 82. The difference signal path is the same as device 40, that is, it uses magnetic field signal generating circuit 42c and magnetic field signal processing circuitry 50c to produce difference signal 58 at output 68. In a GFI application, the total signal 82 would be indicative of a total (or sum) of phase and neutral current magnitudes.

Figure 2C:
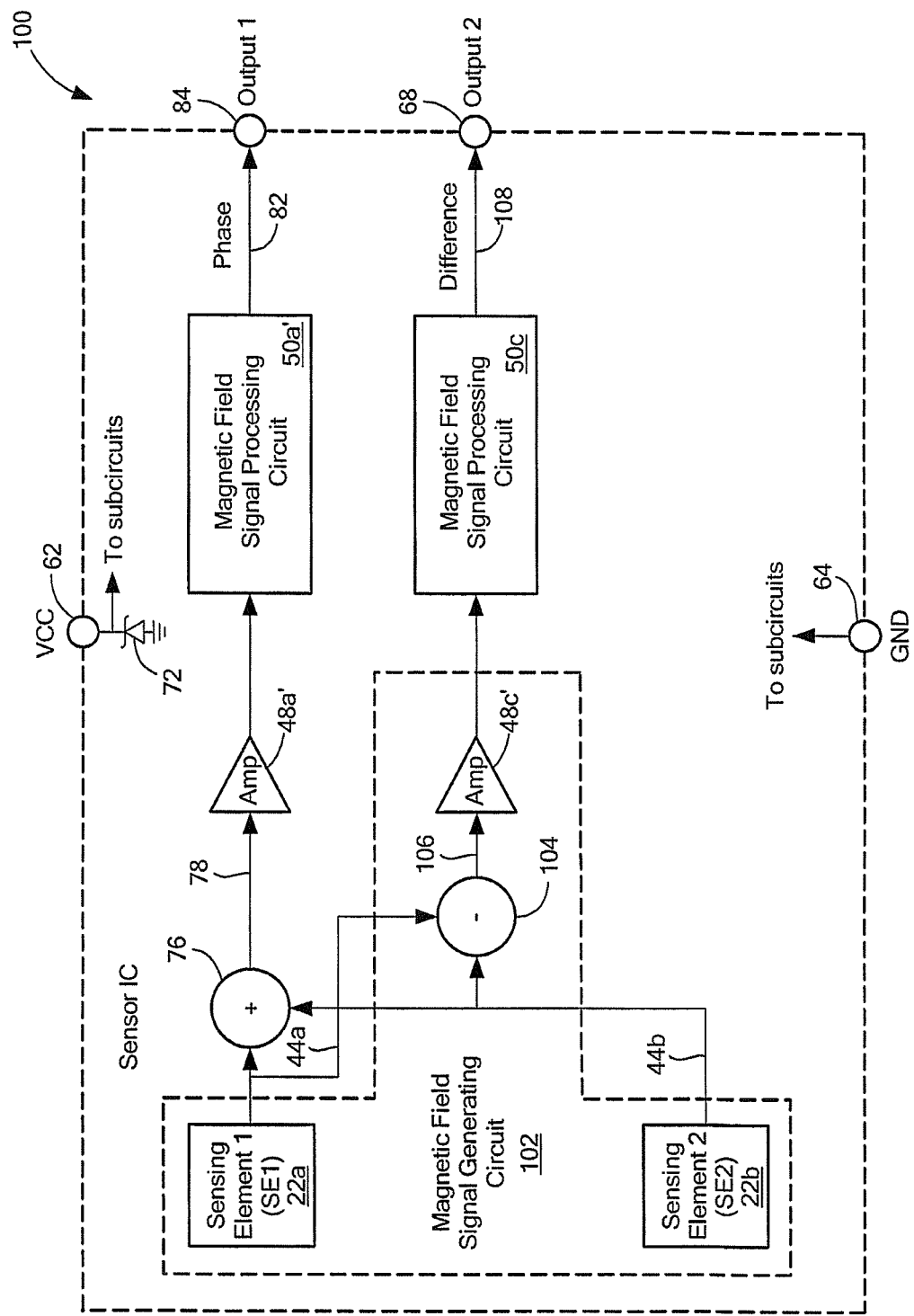
FIG. 2C is block diagram of another example IC implementation for a sensor in which the total of the phase and neutral current amplitudes and the difference between the phase and neutral current amplitudes are available at the sensor output.

In yet another alternative implementation, and referring to FIG. 2C, a sensing device or IC 100, like device 80, provides two outputs corresponding to total and difference signals, but utilizes only sensing elements 22a and 22b to do so. Thus, the only distinction between device 100 and device 80 is that a magnetic field signal generating circuit 102 in device 100 replaces the circuit 42c in device 80. Circuit 102 includes sensing elements 22a and 22b, and a subtractor (or difference) element 104 to take the difference between the outputs 44a and 44b from sensing elements 22a and 22b, respectively, and to provide the result as a difference output 106. Like all of the other magnetic field signal generating circuits, circuit 102 includes an amplifier, shown here as amplifier 48c', to amplify the difference output 106. The corresponding output signal (provided at the output of circuit 50c and made available at output 68) is shown here as difference signal 108. The difference signal 108 indicates a difference determined from the measurements of sensing elements 22a and 22b, not one that is based on the measurement of sensing element 22c (like the difference signal 58 in FIG. 2B).

Some applications may not require absolute current measurements. In such designs, a difference signal only may be needed. That difference signal may be produced/computed by SE1 22a and SE2 22b, or measured by a "middle" sensing element positioned to measure current of both conductors, like SE3 22c. For a computed approach, and referring back to FIG. 2C, the circuitry to support the total current signal (that is, the signal path from sum element 76 through output 84), could be eliminated. In an alternative "measured" approach, and as shown in device 104 of FIG. 2D, the signal paths for (and including) the sensing elements SE1 22a and SE2 22b (e.g., as shown in FIGS. 2A-2B) may be eliminated. All that is required is a difference signal generated based on the differential sensing of at least one sensing element, such as SE2 22c, that is positioned in proximity to both conductors and capable of sensing magnetic fields associated with both of the conductors. It may be desirable to use more than one such sensing element to allow for misalignment detection and correction, as will be discussed later with reference to FIGS. 5A-5D and FIG. 6B.

It will be understood that additional functions can be included in the sensor IC (including but not limited to the embodiments shown in FIGS. 2A-2D) as well, e.g., functions such as those described in any of the above-mentioned patents and patent applications. Functions provided in the ACS 71x family of current sensing ICs available from Allegro Microsystems, Inc., may be incorporated in the sensor IC. For example, the ACS710 current sensor includes internal circuitry and pins to detect overcurrent conditions, as well as provides a zero current reference pin and filter pin to which a user can connect an external capacitor to set device bandwidth. Other exemplary functions, such as those available in the ACS761 current monitor IC, which incorporates circuitry and pins to support various levels of fault protection, including overpower, overcurrent and short circuit faults (with an external high-side FET gate driver for disabling the load), and other features (e.g., valid power indicator), could also be included. The signal paths of the sensor IC embodiments of FIGS. 2A-2D can be implemented in the analog or in the digital domain.

Figure 2D:
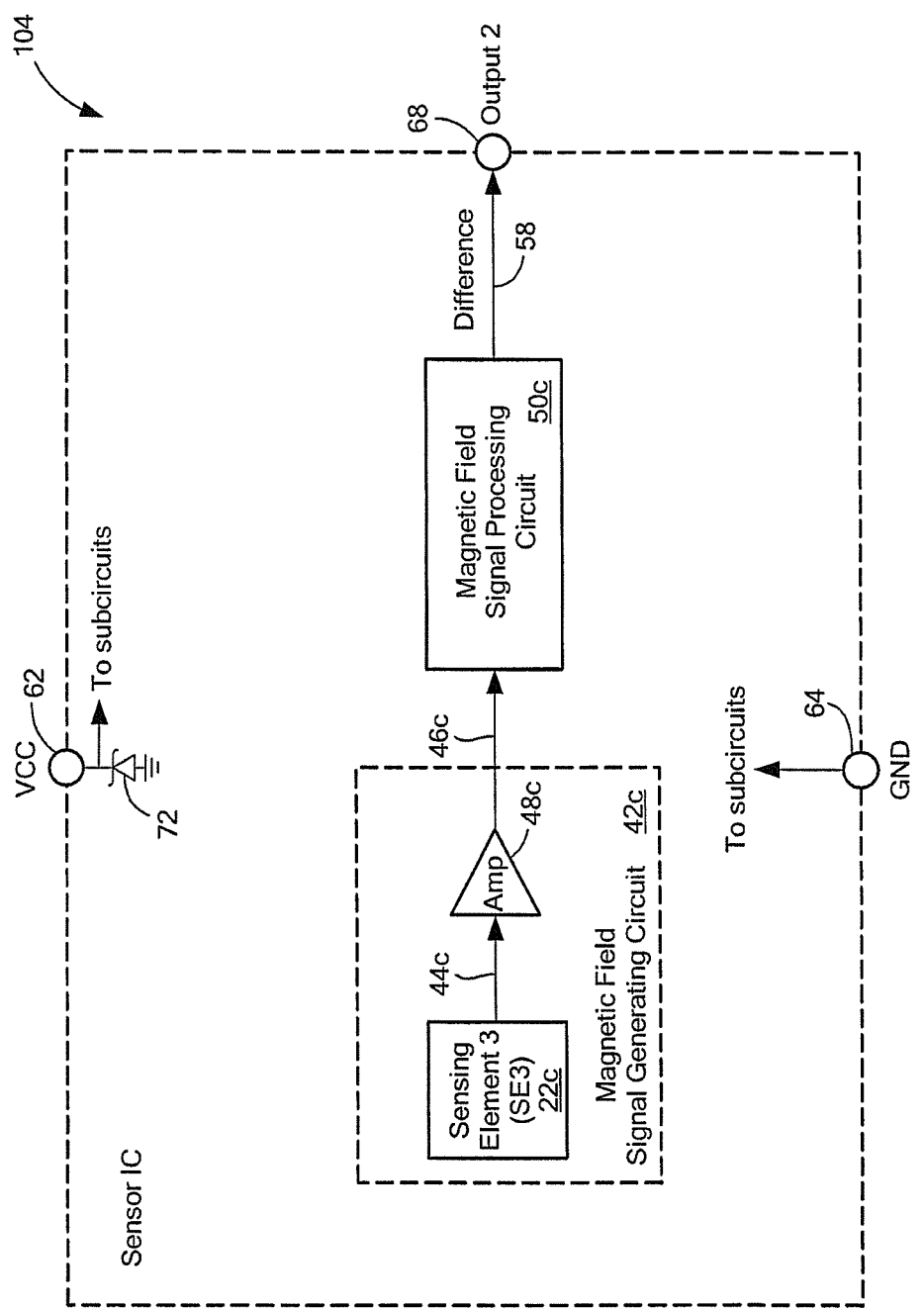
FIG. 2D is a block diagram of example IC implementation for a sensor in which the difference between the phase and neutral current amplitudes is available at the sensor output.

Referring to FIG. 1A in conjunction with FIGS. 2A-2D, current to be measured by the sensor device 40 (or 80, 100 or 104) is applied to the conduction paths 14a and 14b. During operation, the applied current flowing through the conduction paths generates a magnetic field, which is sensed by the one or more of the sensing (or active) elements 22 and converted to a proportional voltage. Sensing element 22a senses the magnetic field associated with the phase current in conduction path 14a and sensing element 22b senses the magnetic field associated with the neutral current in conduction path 14b. In the embodiments of FIGS. 2A, 2B and 2D, the sensing element 22c senses the magnetic fields associated with both the phase current flowing in conduction path 14a and the neutral current flowing in conduction path 14b. When the magnitude of the phase and neutral currents is the same, the two sensed magnetic fields will cancel each other out. When the magnitude of the neutral current is less than that of the phase current, as it would be when a malfunction occurs, the sensing element 22c detects that difference (the amount of current that was diverted from the conduction path 14b). In a two sensing element approach, as is depicted in FIG. 2C, that current difference or loss is determined by taking the difference between the outputs of sensing elements 22a and 22b, as described earlier. The sensor device or IC can be implemented to provide a total signal indicative of the total of the phase and neutral current magnitudes, or alternatively, separate signals indicative of the absolute current in each conduction path, also as described earlier with respect to FIGS. 2A-2C.

It would also be possible to combine the approaches provided in FIGS. 2A, 2B and 2D (measured SE3 difference output) with that of FIG. 2C (difference output derived or computed from SE1 and SE2) to select the difference output with the greater difference value. This combined approach, which could offer an even greater level of protection, could be easily achieved by including circuitry, e.g., an OR gate, to select the greater of the two difference values.

Figure 3:
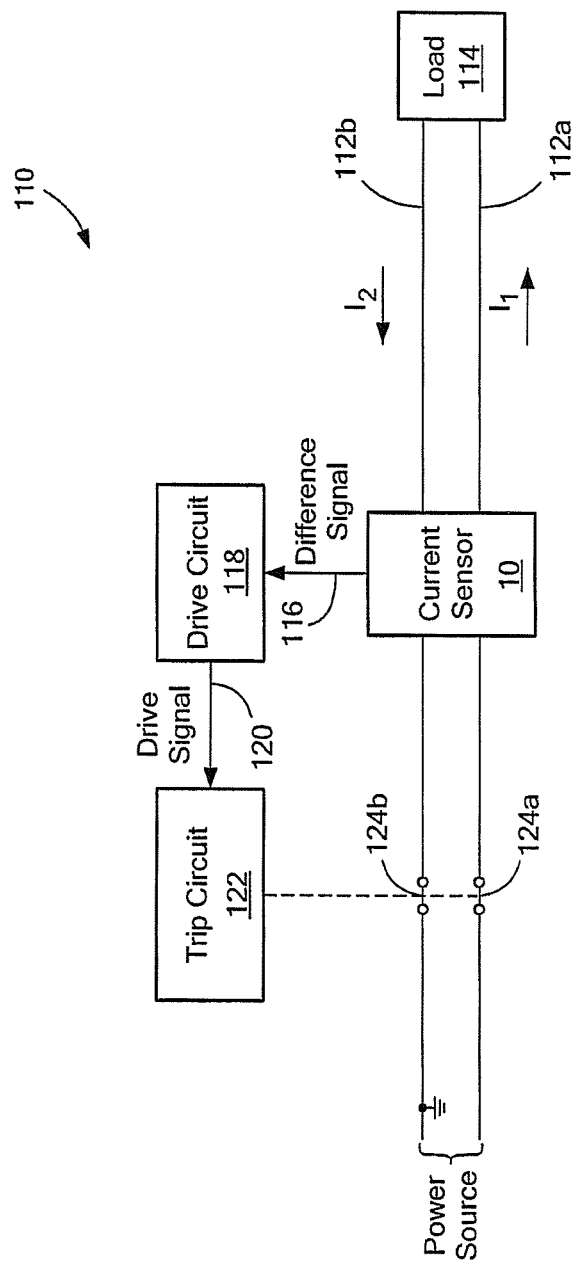
FIG. 3 is a block diagram of a ground fault interrupter circuit application in which a differential current sensor like that shown in FIGS. 1A-2D is employed.

FIG. 3 illustrates a simple ground fault interrupter circuit 110 that employs the differential current sensor 10 (from FIG. 1A). The differential current sensor 10 is coupled to current conductors or wires 112a and 112b, which are connected to a load 114. The current conductor 112a carries the phase current from a power source to the load 114. The current conductor 112b carries the neutral current from the load 114. The sensor 10 measures the difference between the amount of neutral current and the amount of phase current and provides a difference signal, difference signal 116 (generated by the internal sensing IC, e.g., as depicted in FIGS. 2A-2C at output 68) to a drive circuit 118, which provides a drive (or "trip") signal 120 when the difference signal 116 indicates an excessive value. The drive circuit may be implemented as a comparator, for example, a threshold based comparator to indicate if a trip level/threshold has been reached, or window comparator to check for a current mismatch. The GFI circuit 110 also includes a trip circuit 122 (or "circuit breaker"), which actuates a set of switches, for example, switches 124a, 124b (coupled to the conductors/wires 112a, 112b, respectively) in response to the trip signal 120. That is, the trip signal 120 is used to trigger the trip circuit 122 to open the switches 124 (and thus disconnect the power source). The trip circuit 122 may be implemented with any suitable electromechanical trip device, e.g., a trip coil.

It will be understood that FIG. 3 is a simplified depiction of a GFI application and is not intended to show the physical layout of signals at the board or system level. For example, in an actual physical layout employing the sensor 10 as shown in FIG. 1, the current conductors 112a, 112b would be appropriately routed to the current sensor 10 (via the circuit board traces) so that $I_1$ and $I_2$ flow into and out of the current sensor 10 in the same direction as described earlier (and not in opposite directions as shown in FIG. 3). An alternative GFI design in which $I_1$ and $I_2$ flow into and out of the current sensor in opposite directions could also be used, but such a design would need to take into account that SE3 would sense twice the magnetic field.

Figure 4:
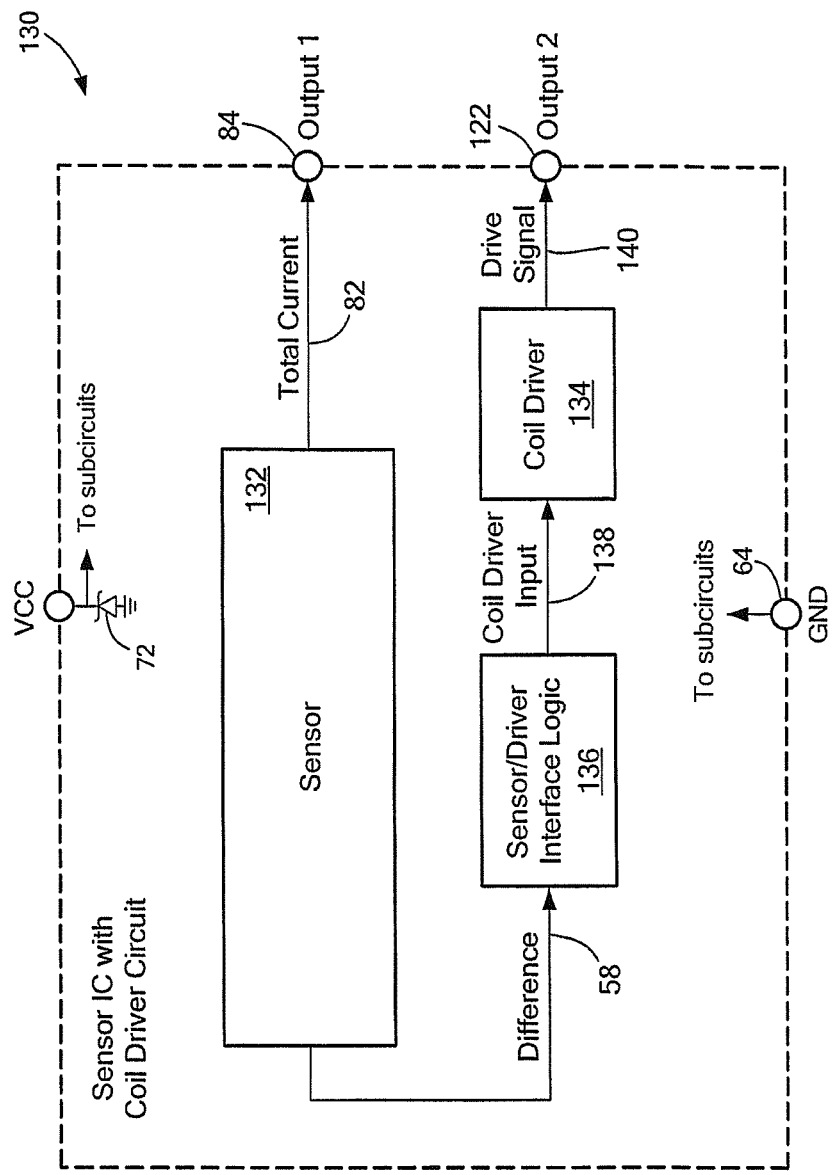
FIG. 4 is a block diagram of an exemplary current sensor IC that includes a coil driver.

It will be appreciated that the functionality of the sensor IC can be varied to suit a particular application. For example, in an alternative embodiment of the sensor IC, circuitry to implement the drive circuit 118 that controls the trip circuit 122 (from FIG. 3) may be integrated on the sensor IC itself. As shown in FIG. 4, a sensor IC with an integrated coil driver circuit, sensor IC 130, can include the internal magnetic field signal generating and processing circuitry from the sensing device, for example, sensor device 80 (from FIG. 2B), indicated here as sensor 132. In this example, based on sensor device 80, the sensor 132 would produce the total current signal 82 and difference signal 58. Like device 80, the new sensor 130 has two outputs, output 84 and output 122. The output 84 receives the total current signal 82. The sensor 130 also includes a coil driver 134 and sensor/driver interface logic 136 to interface the sensor 132 to the coil driver 134. The sensor/driver interface logic 136 receives the difference signal 58 and, in response to that signal, produces a coil driver input signal 138. In response to the coil driver input signal 138, the coil driver 134 generates an appropriate drive signal 140.

Thus, and referring to FIG. 4 in conjunction with FIG. 3, sensor 130 could replace sensor device 20 inside differential current sensor 10 to enable that sensor to directly trigger the trip circuit 122 with the new sensor's drive signal 140. This more integrated solution eliminates the need for the drive circuit 118 in the GFI circuit 110. Although shown as having an internal sensor 132 based on the circuitry shown in FIG. 2B, it will be appreciated that the circuitry of sensor 132 could include that shown in FIG. 2C, or alternatively, the circuitry of sensor IC 40 shown in FIG. 2A with outputs 66 and 70 replacing output 84 or the circuitry of sensor IC 104 shown in FIG. 2D with total current signal 82 and output 84 omitted.

In the assembly of a GFI current sensor like current sensor 10 (from FIG. 1A), mechanical misalignment of the sensing elements relative to the current conduction paths poses a challenge to accurate detection of the required fault current levels. This misalignment may occur as a result of placement of the sensing elements within the sensor IC, or position of the IC within the sensor package or relative to the PC board trace (depending on the design approach, i.e., package with internal conduction paths, or sensing IC and PC board trace).

FIGS. 5A and 5B show partial side views of sensor IC and conduction paths, indicated by reference numerals 150 and 152. FIG. 5A illustrates a perfect alignment of sensing elements 22a, 22b and 22c relative to conduction paths 14a, 14b. FIG. 5B illustrates a case of misalignment. The outline of the IC is omitted, as the misalignment may occur as the result of sensing element spacing on the die or positioning the IC within a sensor package, as discussed above. Other sources of error that would lead to misalignment may include manufacturing tolerances in placement or the width of the conduction paths 14a and 14b. Referring to FIG. 5A, during operation of a perfectly aligned GFI sensor, the current flows in the conduction paths 14a and 14b, resulting in a magnetic field at sensing element 22c of zero. If there is misalignment, the sensing element 22c will not be centered between the two conduction paths 14a and 14b as shown. Instead, and referring to FIG. 5B, the sensing elements 22a, 22b and 22c will be offset to one side, e.g., offset 154, as shown.

Figure 5C:
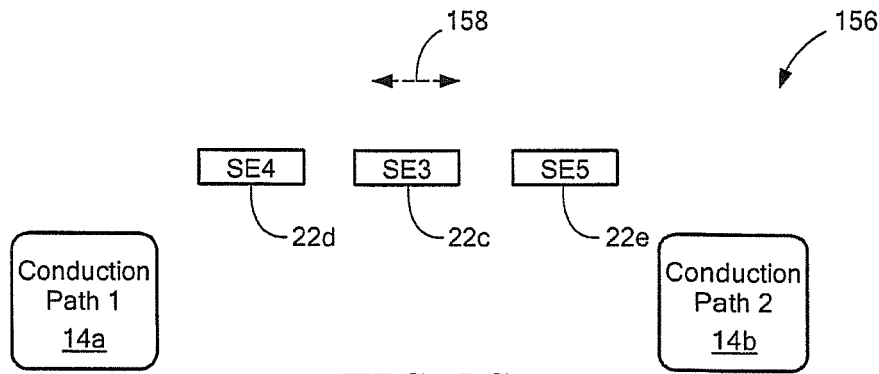
Figure 5D:
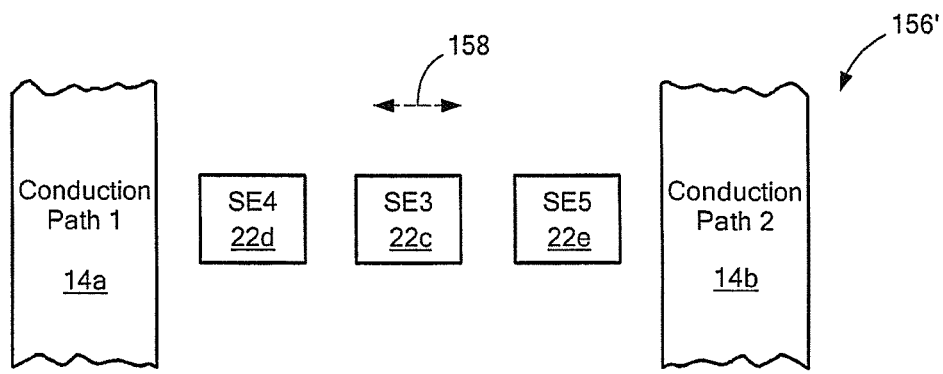
Figure 5E:
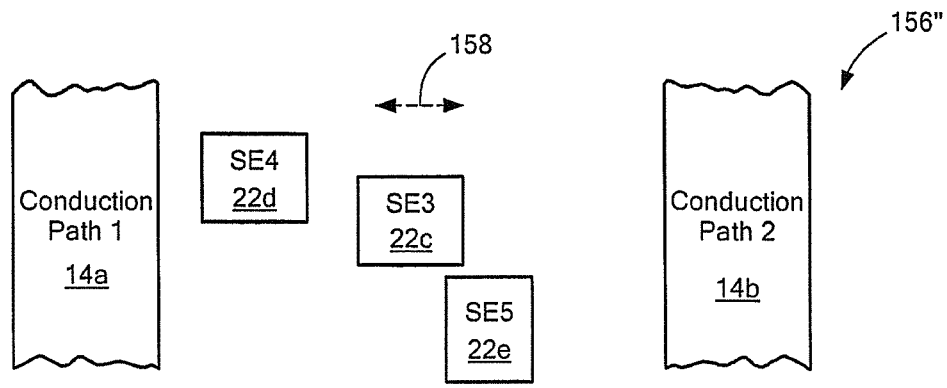

One possible way to adjust for such misalignment is based on an implementation in which multiple "middle", differential sensing elements are used. That is, and as shown in a partial side view 156 in FIG. 5C and a partial top view 156' and 156" in FIG. 5D and FIG. 5E, respectively, the middle (differential current) sensing can be implemented with an arrangement of two or more sensing elements. The arrangement is centered relative to the two conduction paths 14a, 14b when the sensor IC is properly aligned with the conduction paths, as is depicted in FIGS. 5C-5E. The direction of misalignment, should it occur, is indicated by arrow 158. The arrangement is shown in the illustrated example to include sensing element 22c and additional sensing elements 22d and 22e located on either side of sensing element 22c. In terms of sensor layout, the sensing elements 22c-22e may be provided in a linearly spaced arrangement as shown in FIG. 5D or non-linearly spaced arrangement. An example of a non-linearly spaced arrangement of the sensing elements is illustrated in FIG. 5E. Although the illustrated example of FIG. 5E shows sensing elements of uniform size, the size of the sensing elements can vary within a given arrangement. Although the sensing elements 22a and 22b (from FIGS. 5A-5B) have been omitted from the illustrations of FIGS. 5C-5E, it will be understood that the concept of using an arrangement of two or more sensing elements to perform differential current sensing (and from which a single difference signal to indicate a difference in magnitudes of the currents flowing in the two conduction paths 14a, 14b can be generated) is applicable to configurations with and without the sensing elements 22a, 22b.

In the event of an offset, the measurement of the difference between the currents flowing in the conduction paths provided by the middle sensing element 22c (or sensing elements such as sensing elements 22c, 22d, 22e, as shown in FIGS. 5C-5E) may be adjusted in a number of different ways. Based on test data acquired during the sensor IC manufacturing process, the electronics for the sensor IC can be adjusted by means of electronic trimming. For example, and referring to FIGS. 6A-6B, the sensor IC, shown as current sensor IC 160 in FIG. 6A or current sensor IC 160' in FIG. 6B, can include a programmable misalignment offset adjustment block 162, capable of being programmed by an external programming block 163, to compensate for or minimize sensor output inaccuracy introduced by the misalignment. The block 162 can include some type of memory element(s) 164, a digital-to-analog converter 166 to convert digital contents of the memory element(s) 164 to analog format, if necessary, and a programmable control logic block 168 to provide a control interface to the magnetic field signal generating circuits, for example, magnetic field signal generating circuits 42a, 42b, 42c (from FIG. 2A). The memory element(s) 164 can be registers, RAM, one time programmable or re-programmable ROM or other nonvolatile memory. The memory element(s) 164 are coupled to the D/A converter 166 via a memory-to-D/A line 170 and the D/A converter 166 is coupled to the control logic block 168 via a D/A-to-control line 172.

Figure 6A:
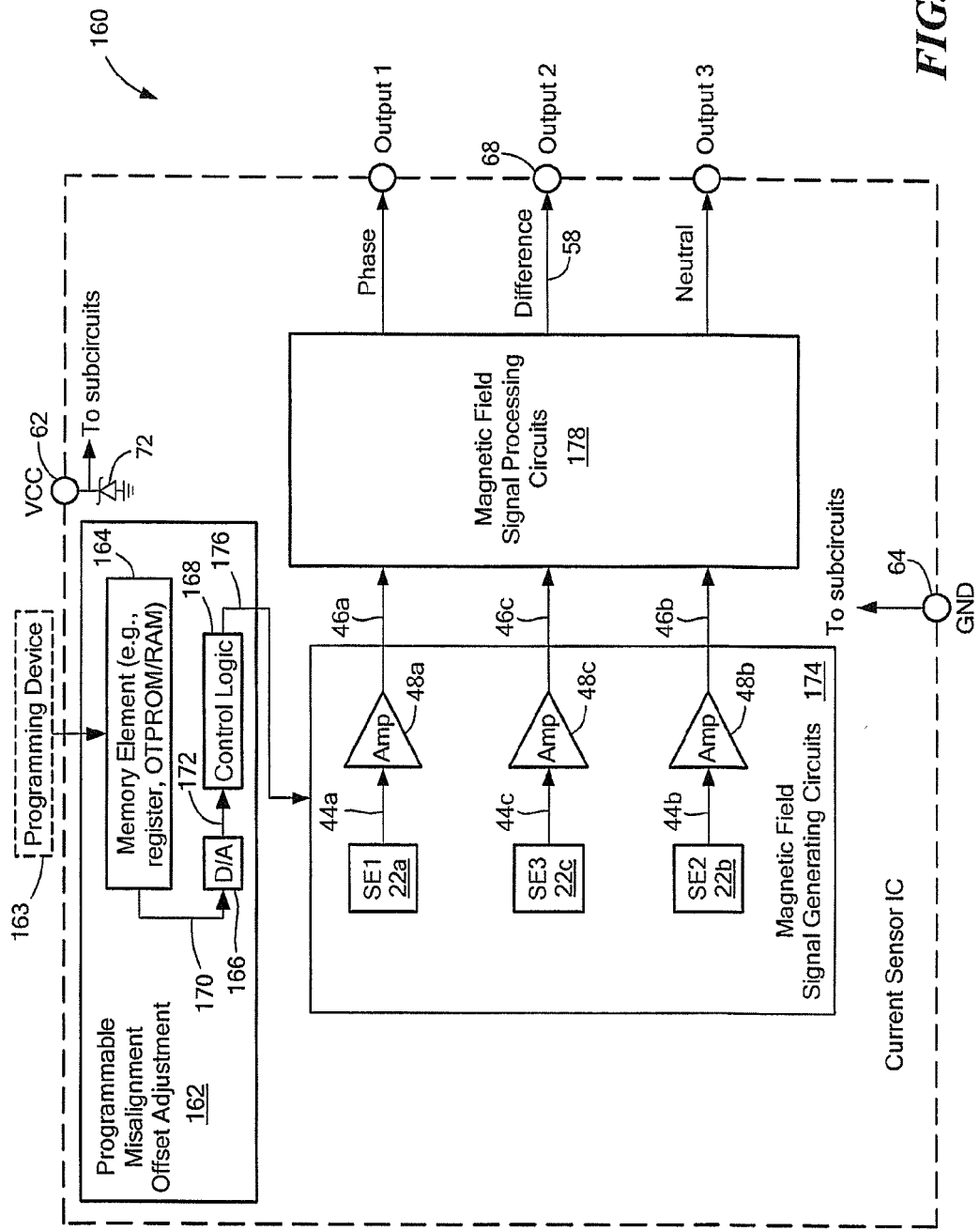
FIGS. 6A-6B are block diagrams of exemplary current sensor ICs that allow for compensation for the type of misalignment illustrated in FIGS. 5A-5B.

Referring to FIG. 6A, the output of the control logic block 168 is provided to the magnetic field signal generating circuits 42a-42c, shown collectively as magnetic field signal generating circuits 174, via a control logic output line 176. The magnetic field signal processing circuits 50a-50c from FIG. 2A are shown collectively as magnetic field signal processing circuits 178. Other features of the sensor IC 160 are the same as shown in FIG. 2A.

Figure 6B:
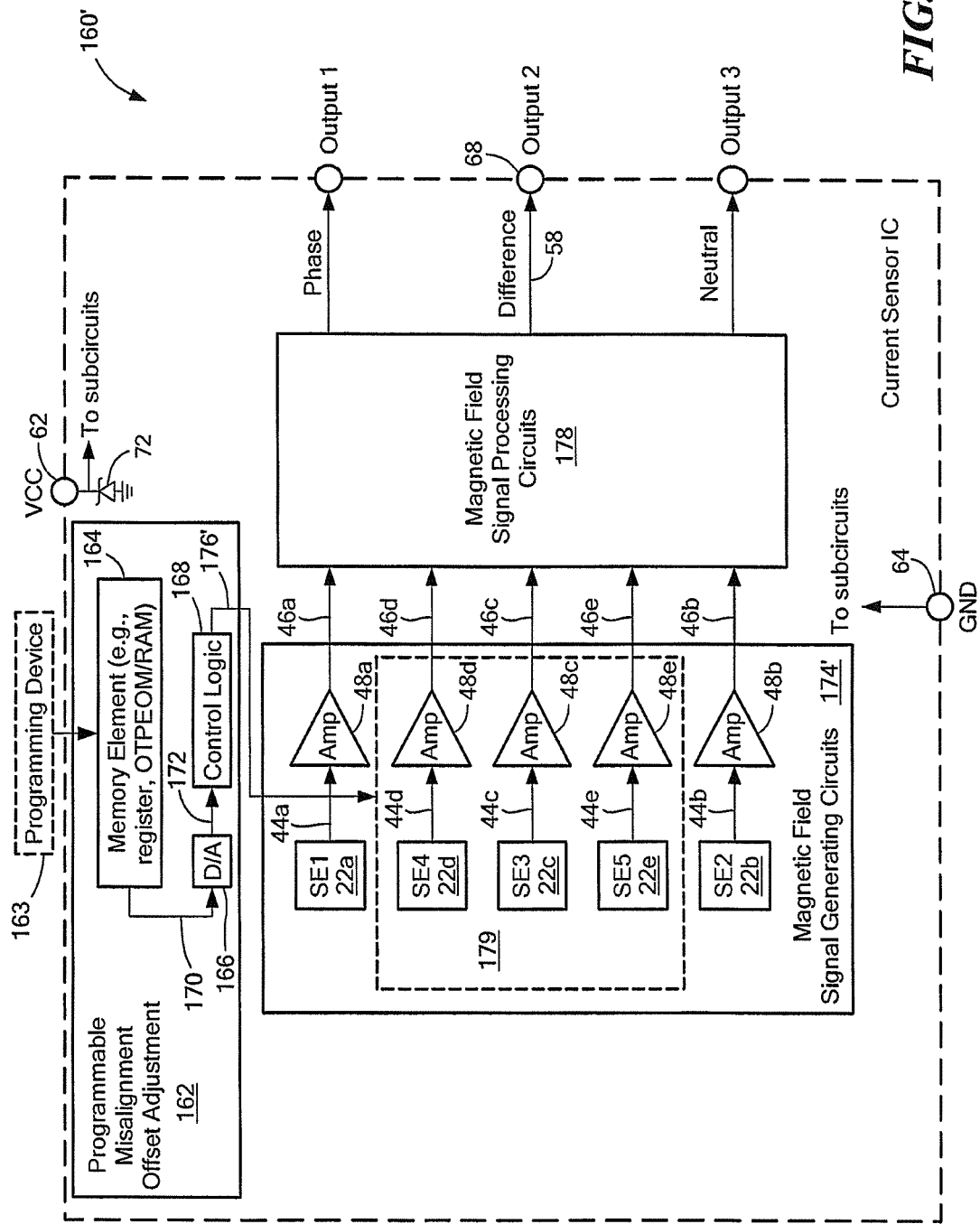

Referring to FIG. 6B, the control logic output line from block 162, indicated here by reference numeral 176', is provided to magnetic field signal generating circuits 174', which differs from the magnetic field signal generating circuits 174 in FIG. 6A in that the circuits 174' also includes magnetic field signal generating circuitry for sensing elements 22d and 22e. Thus, in addition to a magnetic field signal generating circuit 42c for sensing element 22c (as shown in FIGS. 2A and 6A), circuits 174' includes such circuits for sensing elements 22d and 22e. Sensing element 22d provides an output 44d that is amplified by an amplifier 48d, which provides a signal 46d to magnetic signal processing circuits 178. Sensing element 22e provides an output 44e that is amplified by an amplifier 48e, which provides a signal 46e to the magnetic field signal processing circuits 178. The magnetic field signal generating circuitry that produces the signals 46c, 46d and 46e is indicated collectively as block 179. The line 176' is provided to the magnetic field signal generating circuits 174', e.g., at least the portion shown as block 179 (as shown in FIG. 6B).

With the adjustment block 162 (from FIGS. 6A-6B), misalignment compensation or correction can be accomplished with digital correction to the signal paths using parameters programmed into the sensor chip. For example, in one possible implementation, testing can determine the offset (e.g., offset 154 from FIG. 5B) and program the block 162 to add or subtract that offset from the sensing element output 44c. Thus, and referring to FIG. 6A, the offset value would be provided to the memory element(s) 164 and applied to the appropriate sensing element circuitry via the control logic block 168.

In other possible implementations, and referring back to FIGS. 5C-5E in conjunction with FIG. 6B, the adjustment block 162 may be used to select the most accurate of the measurements of the sensing elements, 22c, 22d, 22e or a mathematical arrangement (or combination) of the three sensing elements' measurements to use as the difference measurement. An example of a simple mathematical arrangement would be to average the measurements for two adjacent sensing elements, for example, $(A+B)/2$ to arrive at a value between A and B, where A denotes the measurement associated with sensing element 22d and B denotes the measurement associated with sensing element 22c (for example).

Depending on the direction of the misalignment, the sensing elements of interest for the mathematical averaging could be sensing element 22e and sensing element 22c instead of sensing elements 22d and 22c. Also, the sensing elements 22d, 22c and 22e may be non-linearly spaced (for example, as illustrated in FIG. 5E) to allow other mathematical combinations of interest or positions of interest based on assembly tolerances of the differential current sensor. It may be possible to utilize sensing elements 22a, 22c and 22b in the same manner (as sensing elements 22d, 22c and 22e, respectively), but such usage would be application specific. It is also possible to use some other number of differential current sensing elements than the three shown in FIGS. 5C-5D and 6B, for example, but not limited to: 2, 4, 5, 6, 7 and 8 sensing elements. The number of the sensing elements will be practically limited by required die area and test time to find the best combination to be used in the final product or programming of the individual part. The adjustment could be performed before or after installation, depending on the type of package that is used.

With reference to FIG. 6B, it will be understood that the block 179 (shown in dashed lines) is a programmable or configurable block. That is, it contains various programmable on-chip features (not shown) that enable the desired configuration, e.g., selection and/or combination of signals 44c, 44d and 44e, and appropriate selection of any magnetic field signal generating circuitry and signal paths necessary to provide a single output from block 179. That single output, which may appear at a selected one of lines 46c, 46d and 46e, is provided to the corresponding magnetic field signal processing circuit (in block 178), e.g., circuit 50c shown in FIG. 2A, for generating the difference signal 58 at output 68. That difference signal that appears at output 68 will have been compensated for misalignment offset based on selections applied under the control of programmable misalignment offset adjustment block 162.

Although the example embodiments of FIGS. 6A and 6B include sensing elements 22a, 22b and corresponding signal paths, those sensing elements and signal paths may be eliminated. Alternatively, the magnetic field signal generating and processing circuits associated with the sensing elements 22a, 22b may be replaced with those shown in FIG. 2B (to provide a single "total current" output instead of separate phase and neutral current outputs).

These types of solutions to the misalignment problem may allow sensing element 22c (or 22c, 22d, 22e, if additional sensing elements 22d and 22e are also used) to be implemented as a standard Si Hall plate instead of one made of a more sensitive material, as was mentioned earlier. However, the concept of using multiple sensing elements and selecting the best one or a mathematical combination to provide a value based on the middle sensing element(s), i.e., sensing element 22c or, alternatively, multiple sensing elements, e.g., sensing elements 22c, 22d and 22e, could also be applied to implementations in which any one or more of the sensing elements are made of materials other than Si. It may be sufficient to use one or the other of these approaches, that is, the first approach involving the application of an offset to the SE3 output, or selection of an SE output or mathematical combination of the SE outputs to use as or in place of SE3 for a specific range of possible misalignment. It may also be desirable to include support for both approaches along with appropriate control logic to select one or the other based on the extent of the misalignment (and/or other conditions).

Since the sensor IC depicted in FIGS. 1A-1B and 2A-2C provides information at its outputs corresponding to absolute or total values (in addition to difference values) for a measured parameter, such as current, it is a multi-purpose device that can be used in a variety of different applications. For example, as discussed above, it may be used to measure current in current divider applications or current measurement applications that require redundancy. The device would also be suitable for use in applications that sense magnetic field to measure displacement.

Figure 7A:
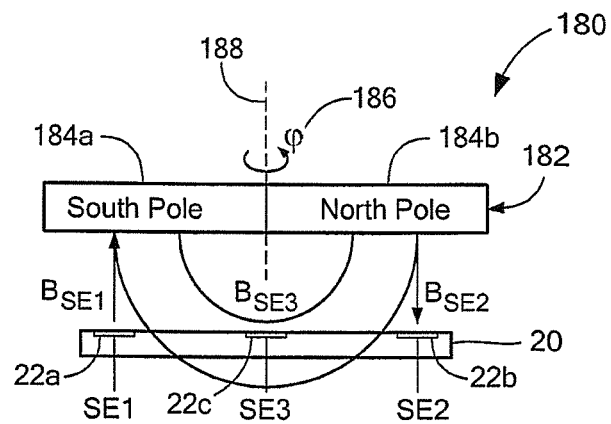
Figure 7B:
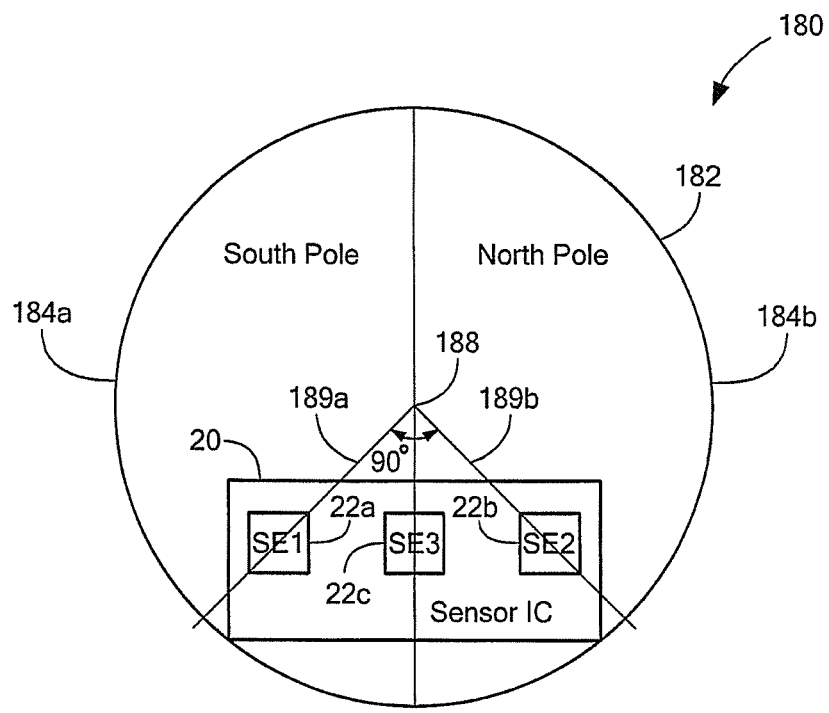

One type of displacement measurement that could be performed by the sensor IC 20 presented in FIG. 1A and FIG. 2A is angular displacement (for rotational position or angle, for example). FIGS. 7A-7B show different views of an example angle sensing structure 180. Referring to FIGS. 7A and 7B, the structure 180 includes a permanent magnet 182 shown as a two-pole magnet having a South pole 184a and a North pole 184b. Positioned in proximity to the magnet 82 is the sensor IC 20. In this application, the sensor IC 20 can determine a rotation angle $\phi$ 186 of the two-pole magnet 182 about an axis of rotation 188. In an exemplary sensor device configuration having the three sensing elements 22a-22c and three outputs, as was illustrated in FIG. 2A, sensing element 22a is used to generate a sine signal and sensing element 22b is used to generate a cosine signal for the rotation angle 186 at outputs 66 and 70, respectively. From the two outputs, a value indicative of the rotation angle 186 can be determined. The rotation angle 186 that is measured can be in the range of 0 to 360 degrees. In an angle sensing application, the sensor IC 20 may be stationary and the magnet 182 attached to a rotating shaft (rotor) near the sensor IC 20.

In one exemplary embodiment, the third (or middle) sensing element 22c is used to detect sensor-to-magnet misalignment. With reference to FIG. 7B, for IC 20 to be aligned with the magnet 182, SE1 22a and SE2 22b have to be positioned on two lines (SE1 on line 189a and SE2 on line 189b) that are at 90 degrees to each other and pass through point 188. In operation, with the depicted alignment, sensing by SE1 22a provides a first sine waveform and sensing by SE2 22b provides a second sine waveform phase shifted by 90 degrees from the first sine waveform (that is, a cosine waveform). Because of its location relative to SE1 22a and SE2 22b, sensing by SE3 22c provides a sine waveform that is phased shifted from the first sine waveform by a phase angle that is less than 90 degrees. In the illustrated arrangement of FIG. 7B, the positioning of SE3 22c is such that it results in a sine waveform that is phase shifted by a phase angle of 45 degrees. More generally, the phase angle may be within a range of values, for example, 30 to 60 degrees. It should be noted that SE3 22c need not be located on a line formed by SE1 22a and SE2 22b, and that the distance from SE3 22c to SE1 22a need not be equal to the distance from SE3 22c to SE2 22b. In prior angle sensing devices with only two sensing elements and capable of producing only a sine signal and a cosine signal, the amplitudes and phases of both signals needed to be examined and corrected, if necessary, in cases of misalignment. Because IC 20 provides an arrangement of three sensing elements, with SE3 22c being located between SE1 22a and SE2 22b (e.g., at a mid-point between SE1 22a and SE2 22b as illustrated in earlier figures and illustrated again in FIGS. 7A and 7B), the IC 20 produces three signals. Referring back to FIG. 2A, the IC 20 generates a sine signal at output 66, a cosine signal at output 70 and a signal produced from sensing by SE3 22c and made available at output 68. Consequently, the signal based in sensing by SE3 22c provides additional information that can be used to determine and correct for misalignment.

More specifically, the signal information from all three sensing elements is used to define an error function or equation. The error function provides an error value "X" as being equal to a mathematical combination of the signal values (that is, amplitudes) of the three signals. An application employing the error function may be implemented to recognize X as a first, "minimal error" value for an alignment condition and as a different second value (e.g., not equal to, or greater than, the first value) for a misalignment condition. In one simplified example, the error function might be represented as $X=A_{SE1}+A_{SE2}-A_{SE3}$ (where $A_{SE1}$, $A_{SE2}$ and $A_{SE3}$ are signal amplitude values for the signals produced as a result of sensing by SE1 22a, SE2 22b and SE3 22c, respectively), with X=0 indicating alignment and X≠0 indicating misalignment.

The goal of an application that uses an error function based on the sensing of SE1 22a, SE2 22b and SE3 22c, as described above, is to minimize the error function (and thus the amount of misalignment) for a desired level of accuracy in angle determination. It can do so through some form of correction. The correction may be implemented electronically or with a mechanical adjustment of the sensor/magnet assembly for optimal alignment, resulting in improved angle accuracy.

Figure 8A:
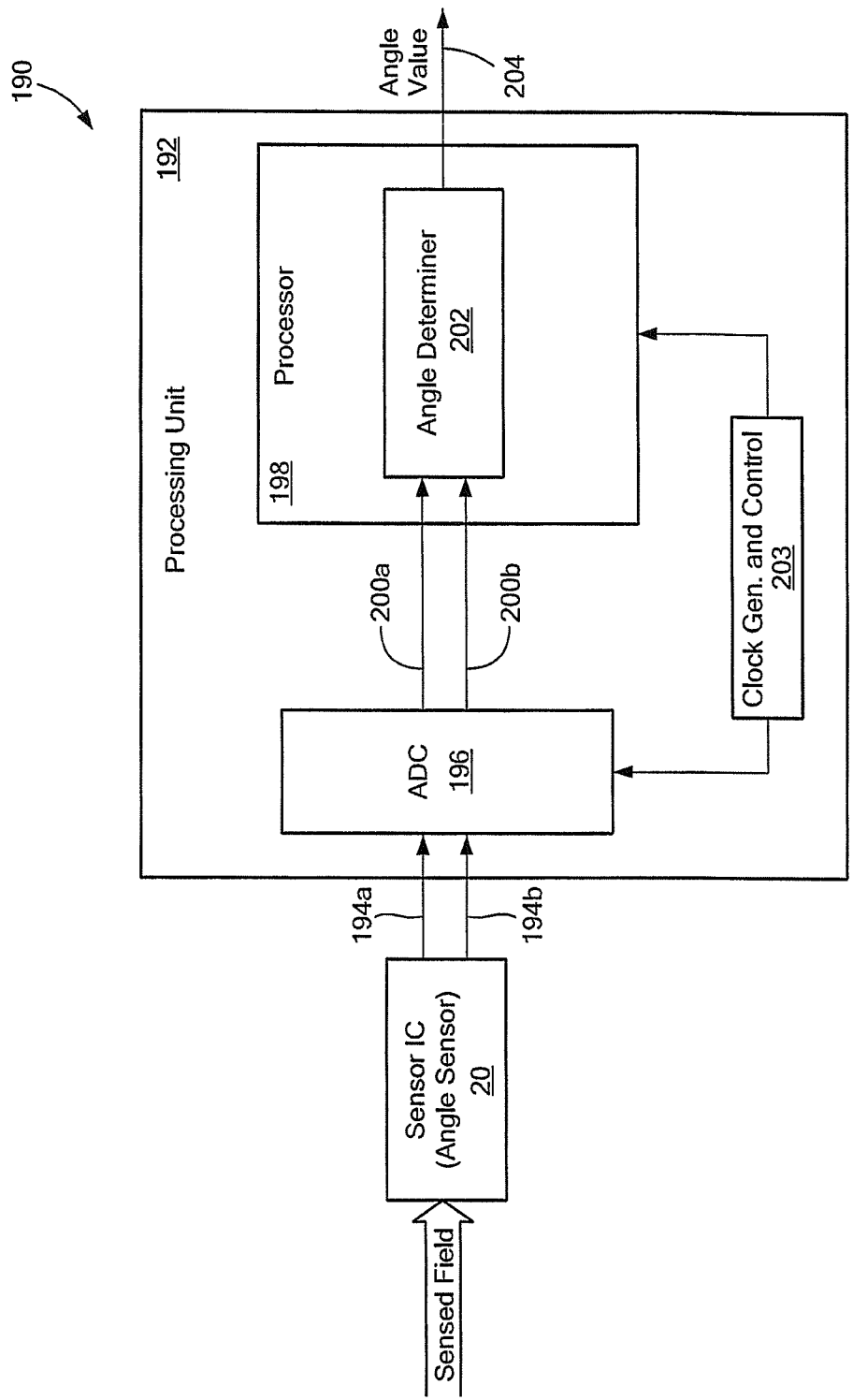
FIGS. 8A-8B are diagrams illustrating exemplary angle sensor devices that include a sensor IC like that shown in FIGS. 1A-1B and FIG. 2A as an angle sensor.
Figure 8B:
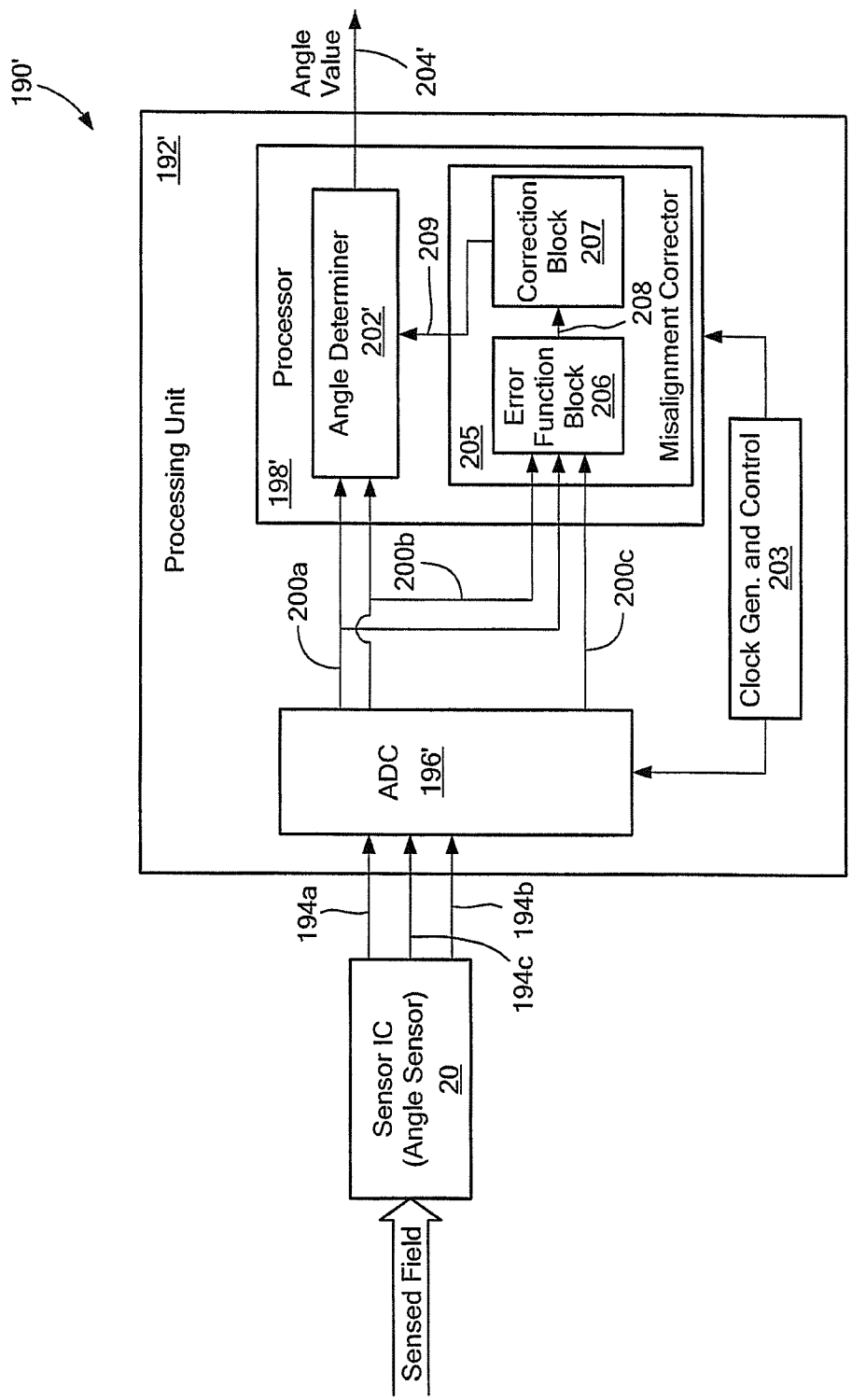

FIGS. 8A-8B show exemplary angle measurement devices 190 (FIG. 8A) and 190' (FIG. 8B) that utilize the output of the angle sensor to determine a rotation angle value. The angle measurement device 190 (or 190') includes an angle sensor, for example, the sensor IC 20 from FIG. 2A, and a processing unit 192 (FIG. 8A) or 192' (FIG. 8B). The signal processing unit 192 (or 192') performs the angle calculation. It combines the two absolute output signals from the angle sensor 20 into one digital output signal. The processing unit 192 (or 192') provides a digital output, although it could be designed to provide an analog output instead. Output signals provided at the sensor's outputs 66 and 70, shown here as output signals 194a, 194b, are sampled and then converted into the digital domain by an Analog-to-Digital Converter (ADC) 196 (FIG. 8A) or 196' (FIG. 8B). A processor (or microcontroller) 198 (FIG. 8A) or 198' (FIG. 8B) receives digital representations of the sensor output signals, shown as ADC outputs 200a, 200b, and uses software shown as an angle determiner 202 (FIG. 8A) or 202' (FIG. 8B) to determine an angle value from the ADC outputs 200a, 200b. Various algorithms, for example, the well-known CORDIC (for COordinate Rotation DIgital Computer) algorithm, may be used to perform the arctangent (or "arctan") trigonometric function calculation for angle value determination. Other algorithms that can determine the angle value from the sine and cosine signals may be used as well. Clock and control signals are provided to the ADC 196 (or 196') and the processor 198 (or 198') by a clock generation and control circuit 203. Once the angle is determined, it is represented as an angle value at an output 204 (FIG. 8A) or 204' (FIG. 8B) that is accessible by an external controller or user (not shown).

In one implementation of an electronic misalignment detection and correction, as illustrated in FIG. 8B, the output signal provided at the sensor's output 68 (from FIG. 2A), shown here as output signal 194c, provides information that is used to compensate for the sensor-to-magnet misalignment electronically. The output signal 194c is sampled and then converted into the digital domain by the ADC 196'. The processor 198' receives the digital representation of that sensor output signal, shown as ADC output 200c, along with the ADC outputs 200a and 200b, and uses software shown as misalignment corrector 205 to compute the error function and to compensate for misalignment indicated by the error function. In the example architecture of FIG. 8B, the misalignment corrector 205 includes an error determiner (or error function block) 206 and a corrector (or correction block) 207. The error function block 206 defines an error function that combines the signal values 200a, 200b and 200c, and performs the error function to generate an error value 208 indicative of alignment or misalignment. The error value 208 is provided to the correction block 207, which determines an appropriate correction based on the error value 208 and provides correction information 209 to the angle determiner 202'. In the illustrated embodiment, the angle determiner 202' uses the correction information to produce the angle value 204'. That is, the angle determiner 202' produces an angle value that has been corrected for any misalignment detected by the misalignment corrector 205.

One exemplary process that utilizes an electronic misalignment detection/correction of the type shown in FIG. 8B would be as follows. After the magnet is rotated, e.g., one half turn or one full turn, the misalignment corrector 205 receives the signal values 200a, 220b and 200c, and uses those signal values to compute the error value (according to a predetermined error function, as discussed above) to detect misalignment. The misalignment corrector 205 then applies a correction to the output produced by the angle determiner 202' (or provides correction information 209 to angle determiner 202', which incorporates the correction information in its angle determination, as discussed above), thus minimizing error on the angle value 204'. The correction block 207 could be configured to compute a correction value "on-the-fly." Other implementations are possible as well. For example, the correction block 207 could be provided with a lookup table of predetermined correction values and configured to perform a lookup to provide appropriate correction values for computed error values.

Alternatively, the process could include an electronic misalignment detection and mechanical misalignment correction. The misalignment detection could be performed "externally" using a device like the programming device 163 shown in FIG. 6. The user could rotate the magnet (again, for example, one half turn or one full turn) and examine the sensor output signals 194a, 194b and 194c to detect misalignment. This could be done, for example, by using software running on the programming device 163. In this embodiment, the software of programming device 163 would include an error function block (like error function block 206 of the processing unit 192' of FIG. 8B) to provide an error value based on a mathematical combination of the signals 194a-194c. When the error value indicates misalignment, the user would then correct the misalignment mechanically, that is, by adjusting the magnet-to-sensor position in that user's system and possibly repeating this routine (e.g., by performing the magnet rotation followed by the error function computation, for each magnet-to-sensor position) until minimal error function corresponding to a desired degree of alignment is achieved. After the completion of the misalignment detection and correction, the angle sensor (e.g., IC 20) outputs 194a and 194b could be processed by a device such as processing unit 192 (FIG. 8BA) for angle determination. An electronic misalignment correction of the type provided by a device like processing unit 192' (FIG. 8B) would not be necessary.

In yet another alternative embodiment, hardware and/or software to implement the error function block may be included in IC 20. If IC 20 is modified to include this functionality, then the functionality need not be provided elsewhere, for example, in misalignment corrector 205 (of FIG. 8B) for applications that utilize electronic misalignment correction or other devices such as programming device 163 for applications that utilize a mechanical misalignment correction.

Although the permanent magnet 182 illustrated in FIGS. 7A-7B has only one pair of North/South poles, the above-described approach to misalignment detection and correction is also applicable to sensing applications that utilize magnets with more than one pole pair. The use of a magnet with more than one pole pair is possible as long as the positions of SE1 22a and SE2 22b are such that they generate 90 degrees out-of-phase signals when the sensor 20 is aligned with the magnet. The sensor IC 20 and processing unit 192 (or 192') may be packaged in separate integrated circuit chips. Alternatively, devices can be manufactured that incorporate both sensor and processing electronics on the same chip.

Figure 9:
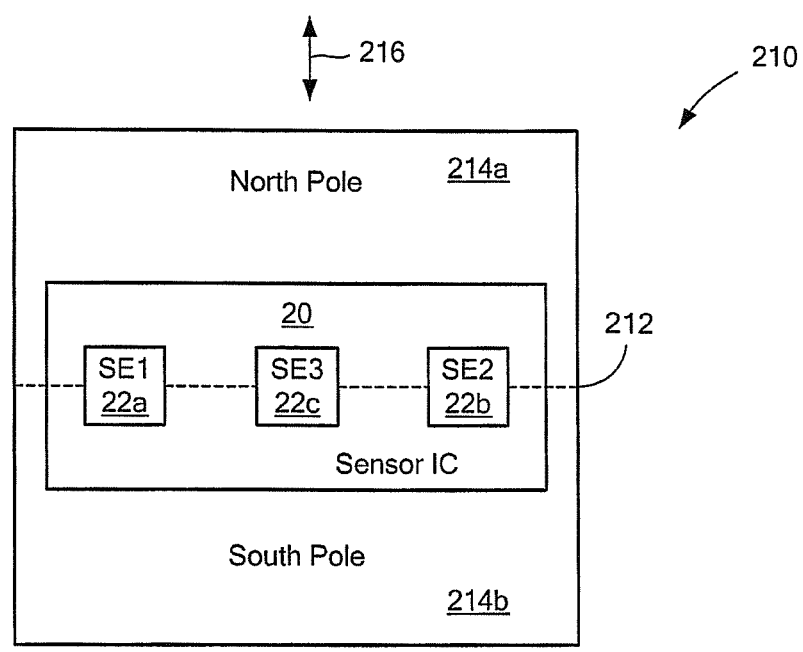
FIG. 9 is a diagram illustrating an exemplary linear position sensing application that includes a sensor IC like that shown in FIGS. 1A-1B and FIG. 2A.

Another type of displacement measurement that could be performed by the sensor IC 20 presented in FIG. 1A-1B and FIG. 2A is linear displacement. The sensor IC would be particularly useful for a linear displacement measurement application requiring redundancy. For example, and referring to FIG. 9 in conjunction with FIG. 2A, in a linear displacement measurement application 210 that uses a bar magnet 212 having a North pole 214a and a South pole 214b in proximity to the sensor IC 20, the sensing elements 22a, 22b, 22c of sensor IC 20 would sense the magnetic field associated with the linear movement of the bar magnet. Thus, in this type of application, the middle sensing element 22c is now performing the same function as the other sensing elements 22a, 22b, that is, it is making an absolute (rather than a differential) measurement. In the illustrated configuration, the path of linear motion is along an axis indicated by an arrow 216. That movement or displacement, which could be bidirectional or unidirectional, would be represented as a linear voltage value (proportional to the magnetic field) at corresponding outputs 66, 70, 68. In a redundancy application, only one of the outputs 66, 68, 70 would be used at any given time. The application (or alternatively, the IC itself) could be configured with a failover type scheme to switch from the output currently in use to one of the unused outputs, e.g., when an error has occurred.

It will be understood that the IC 20 and magnet 212 would be part of a larger system (not shown), for example, a magnet and sensor IC/coil assembly (of a linear motor or other linear motion system). In such a system, when a current is applied to the coil, the flux generated by the energized coil interacts with flux generated by the magnet, which causes the magnet to move either in one direction or the opposite direction depending on the polarity of the coil flux.

The sensor device described above can be used in any consumer, industrial or automotive application requiring the measurement of a small difference between two similar currents, and is therefore not limited to GFI applications. Also, since it can be implemented to include two individual magnetic field sensing elements to measure the absolute incoming currents, the sensor device can be used for redundancy applications if the same current is applied to both conduction paths. The sensor device can also be used for linear position applications requiring redundancy, as well as for 360 degree angle sensing. In the angle sensing application, two sensing elements can provide sine and cosine signals for the angle determination, and the third sensing element can be used to improve magnet-to-sensor alignment (and therefore total angle accuracy), as discussed above.

The use of an arrangement of multiple "middle" SEs, for example, SE3 22c, SE4 22d and SE5 22e (as described earlier with reference to FIGS. 5C-5E and 6B), although illustrated in the context of a current sensing application, is applicable to other applications such as linear and angular displacement (or position) sensing, speed sensing and proximity sensing as well. For example, and referring again to FIGS. 5D-5E and FIG. 9, the middle element SE3 22c of FIG. 9 could be replaced with an arrangement of multiple SEs (as shown in FIG. 5D, for example). However, the arrangement may need to have a different orientation, for example, a vertical orientation in the FIG. 9 example. In absence of any misalignment, the arrangement would be centered relative to the external target (that is, the source of the magnetic flux to be sensed by the SEs, whether that source is a pair of current conduction paths or magnet(s)) for a zero field indication. If misalignment between the sensor and such target should occur, a non-zero field would be indicated by the arrangement. One of the misalignment offset compensation schemes discussed earlier could then be used to "zero" the result provided by the arrangement so that the sensor output signal (such as a difference signal for a GFI application current sensor, as described above, or a linear position sensor's output signal, for example) is more accurate.

Figure 10:
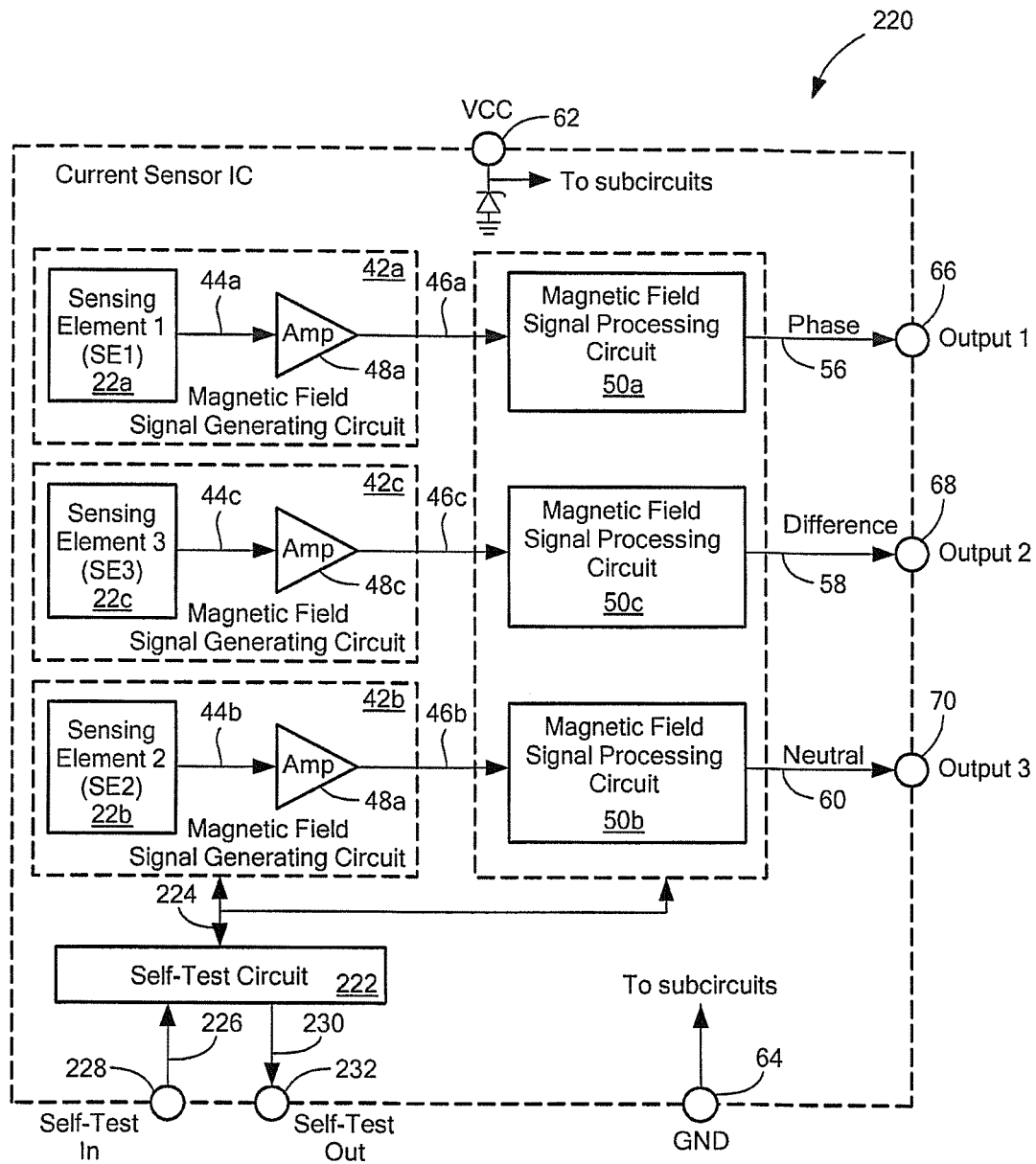
FIG. 10 is a diagram illustrating a current sensor IC like that shown in FIG. 2A that also includes self-test support.

Other functionality may be included in the differential current sensor (such as current sensor 10 as illustrated in FIG. 1) as well. For example, and as shown in FIG. 10, the sensor circuitry can be modified to provide a sensor IC 220 that includes a self-test block or circuit (also referred to as a built-in self-test or "BIST" circuit) 222, coupled to subcircuits via an interconnect 224, to provide self-test functionality. The self-test circuit 222 could have at least one input line 226 and output line 230 and corresponding terminals 228 and 232, respectively, for exchanging diagnostics test information with an external device (e.g., a controller). For example, a command or request for diagnostics test could be provided to the self-test circuit 222 on the input line 226 (via terminal 228) and results could be returned on the output line 230 (via terminal 232). The self-test circuit 222, in response to a command on input line 226, would enable self-test of at least some or all of the various subcircuits (such as circuits 42a-42c and circuits 50a-50c). Although the self-test circuit is shown as part of a sensor IC like that shown in FIG. 2A, it is applicable to other described embodiments as well. This type of circuitry would provide added safety, thus making its inclusion particularly attractive for GFI applications. The self-test circuit 222 can be implemented in a number of different ways, according to design and application requirements. For example, it could be implemented to incorporate self-test features described in U.S. Patent Application Publication No. US2010/0211347, of application Ser. No. 12/706,318 entitled "Circuits and Methods for Generating a Self-Test of a Magnetic Field Sensor," filed Feb. 16, 2010 and assigned to Allegro Microsystems, Inc., the assignee of the subject application. For example, the self-test circuit 222 can be implemented to include a self-test current conductor for generating a self-test magnetic field and circuitry to process the measured self-test magnetic field to generate a diagnostic and/or other signal(s), as discussed in the aforementioned patent application. The use of other types of self-test/BIST mechanisms is contemplated as well.

In any of the above-described embodiments, each sensing element may be a device made of a IV type semiconductor material such as Si or Ge, or a III-V type semiconductor material like GaAs or an Indium compound.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A differential current sensor comprising:
    a first current conduction path having a first input terminal and a first output terminal and a second current conduction path electrically isolated from the first current conduction path and having a second input terminal and a second output terminal;
    magnetic field sensing elements including a first sensing element to sense a magnetic field associated with a first current carried by the first current conduction path and a second sensing element to sense a magnetic field associated with a second current carried by the second current conduction path;
    circuitry, coupled to the magnetic field sensing elements, to provide an output signal; and
    wherein the output signal comprises a difference signal indicative of a difference between a magnitude of the first current and a magnitude of the second current.

2. The differential current sensor of claim 1 wherein the circuitry operates to generate first and second signals based on the sensed first and second magnetic fields.

3. The differential current sensor of claim 2 wherein the circuitry operates to use the first and second signals to produce the difference signal.

4. The differential current sensor of claim 3 wherein the circuitry further operates to provide a total current output signal based on a sum of the first and second signals and indicative of a total of the magnitude of the first current and the magnitude of the second current.

5. The differential current sensor of claim 2 wherein the magnetic field sensing elements includes a third sensing element located between the first sensing element and the second element to sense the magnetic fields associated with the first and second currents, and wherein the circuitry further operates to generate a third signal based on sensing by the third sensing element and to use the third signal to produce the difference signal.

6. The differential current sensor of claim 5 wherein the circuitry further operates to provide an output signal based on the first signal and indicative of the magnitude of the first current and to provide an output signal based on the second signal and indicative of the magnitude of the second current.

7. The differential current sensor of claim 5 wherein the circuitry further operates to provide a total current output signal based on a sum of the first and second signals and indicative of a total of the magnitude of the first current and the magnitude of the second current.

8. The differential current sensor of claim 5 wherein the first and second sensing elements are made of a first semiconductor material and the third sensing element is made of a second semiconductor material more magnetically sensitive than the first semiconductor material.

9. The differential current sensor of claim 8 wherein the first semiconductor material is Silicon and the second semiconductor material is a selected one of Germanium, Gallium Arsenide or other high mobility compound semiconductor material.

10. The differential current sensor of claim 5 wherein the first, second and third sensing elements are made of the same semiconductor material.

11. The differential current sensor of claim 5 wherein each of the first, second and third sensing elements comprises a selected one of a Hall-effect sensing element and a magnetoresistive sensing element.

12. The differential current sensor of claim 11 wherein each of the first, second and third sensing elements is made of a selected one of a IV type semiconductor material and a III-V type semiconductor material.

13. The differential current sensor of claim 5, further comprising:
    a programmable misalignment adjustment block to electronically compensate the difference signal for misalignment between the magnetic field sensing elements and the first and second current conduction paths.

14. The differential current sensor of claim 13 wherein the programmable misalignment adjustment block is programmed to apply an offset value to the third signal when a test of the differential current sensor indicates a misalignment.

15. The differential current sensor of claim 2 wherein the magnetic field sensing elements further include an arrangement of one or more additional sensing elements located between the first sensing element and the second element to sense the magnetic fields associated with the first and second currents, and the circuitry further operates to produce the difference signal based on the sensing of at least one of the one or more additional sensing elements.

16. The differential current sensor of claim 15, further comprising:
    a programmable misalignment adjustment block to electronically compensate the difference signal for misalignment between the magnetic field sensing elements and the first and second current conduction paths, the programmable misalignment block being programmed to control the circuitry to produce the difference signal based on a mathematical combination of measurements of the one or more additional sensing elements.

17. The differential current sensor of claim 1, further comprising:
    a sensor integrated circuit,
    wherein the magnetic field sensing elements and the circuitry are provided in the sensor integrated circuit and the sensor integrated circuit has an output corresponding to the output signal.

18. The differential current sensor of claim 17 wherein one or both of the first current conduction path and the second current conduction path comprises a printed circuit board trace.

19. The differential current sensor of claim 17 wherein the first and second current conduction paths are enclosed in a package along with the sensor integrated circuit and wherein the package has pins corresponding to the outputs of the sensor integrated circuit and the terminals of the first and second current conduction paths.

20. The differential current sensor of claim 17 wherein the first current conduction path is usable to carry a phase current and the second current conduction path is usable to carry a neutral current when the first and second current conduction paths are coupled to phase and neutral current conductors of a ground fault interrupter application.

21. The differential current sensor of claim 20, further comprising:
    a coil driver and interface logic to interface the circuitry to the coil driver, the interface logic to receive the difference signal from the circuitry and generate an input signal to the coil driver and the coil driver, in response to the input signal, to provide a drive signal to drive a coil of an external trip circuit.

22. The differential current sensor of claim 21 wherein the magnetic field sensing elements, the circuitry, the coil driver and the interface logic are integrated on a common substrate as an integrated circuit.

23. The differential current sensor of claim 1 further comprising a self-test circuit.

24. The differential current sensor of claim 1 wherein each of the magnetic field sensing elements comprises a selected one of a Hall-effect sensing element and a magnetoresistive sensing element.

25. The differential current sensor of claim 24 wherein each of the magnetic field sensing elements is made of a selected one of a IV type semiconductor material and a III-V type semiconductor material.

26. The differential current sensor of claim 1 wherein the first current is a phase current and the second current is a neutral current.

27. The differential current sensor of claim 1 wherein the magnetic field sensing elements and circuitry are integrated on a common substrate as an integrated circuit.

28. A differential current sensor comprising:
a first current conduction path having a first input terminal and a first output terminal and a second current conduction path electrically isolated from the first current conduction path and having a second input terminal and a second output terminal;
magnetic field sensing elements to sense a first magnetic field associated with a first current carried by the first current conduction path and a second magnetic field associated with a second current carried by the second current conduction path, including a first sensing element and a second sensing element each to sense one of the first and second magnetic fields, and a third sensing element located between the first and second sensing elements to sense both of the first and second magnetic fields; and
circuitry, coupled to the magnetic field sensing elements, to generate a signal based on sensing of the third sensing element and provide an output signal based on the signal.

29. The differential current sensor of claim 28 wherein the circuitry operates to generate first and second signals based on the sensed first and second magnetic fields and wherein the signal based on sensing of the third sensing element is a third signal.

30. The differential current sensor of claim 29 wherein the circuitry operates to use the first and second signals to produce a difference signal indicative of a difference between a magnitude of the first current and a magnitude of the second current.

31. The differential current sensor of claim 30 wherein the circuitry further operates to provide a total current output signal based on a sum of the first and second signals and indicative of a total of the magnitude of the first current and the magnitude of the second current.

32. The differential current sensor of claim 30 wherein the circuitry further operates to use the third signal to produce the difference signal.

33. The differential current sensor of claim 29 wherein the output signal is a third output signal and wherein the circuitry further operates to provide a first output signal based on the first signal and indicative of the magnitude of the first current and to provide a second output signal based on the second signal and indicative of the magnitude of the second current.

34. The differential current sensor of claim 28 wherein the first and second sensing elements are made of a first semiconductor material and the third sensing element is made of a second semiconductor material more magnetically sensitive than the first semiconductor material.

35. The differential current sensor of claim 34 wherein the first semiconductor material is Silicon and the second semiconductor material is a selected one of Germanium, Gallium Arsenide or other high mobility compound semiconductor material.

36. The differential current sensor of claim 28 wherein the first, second and third sensing elements are made of the same semiconductor material.

37. The differential current sensor of claim 28 wherein each of the first, second and third sensing elements comprises a selected one of a Hall-effect sensing element and a magnetoresistive sensing element.

38. The differential current sensor of claim 37 wherein each of the first, second and third sensing elements is made of a selected one of a IV type semiconductor material and a III-V type semiconductor material.

39. The differential current sensor of claim 30, further comprising:
a programmable misalignment adjustment block to electronically compensate the difference signal for misalignment between the magnetic field sensing elements and the first and second current conduction paths.

40. The differential current sensor of claim 39 wherein the programmable misalignment adjustment block is programmed to apply an offset value to the third signal when a test of the differential current sensor indicates a misalignment.

41. The differential current sensor of claim 30 wherein the magnetic field sensing elements further include an arrangement of one or more additional sensing elements located between the first sensing element and the second element to sense the magnetic fields associated with the first and second currents, and the circuitry further operates to produce the difference signal based on the sensing of at least one of the one or more additional sensing elements.

42. The differential current sensor of claim 41, further comprising:
a programmable misalignment adjustment block to electronically compensate the difference signal for misalignment between the magnetic field sensing elements and the first and second current conduction paths, the programmable misalignment block being programmed to control the circuitry to produce the difference signal based on a mathematical combination of measurements of the one or more additional sensing elements.

43. The differential current sensor of claim 28, further comprising:
a sensor integrated circuit,
wherein the magnetic field sensing elements and the circuitry are provided in the sensor integrated circuit and the sensor integrated circuit has an output corresponding to the output signal.

44. The differential current sensor of claim 43 wherein one or both of the first current conduction path and the second current conduction path comprises a printed circuit board trace.

45. The differential current sensor of claim 43 wherein the fist and second current conduction paths are enclosed in a package along with the sensor integrated circuit and wherein the package has pins corresponding to the outputs of the sensor integrated circuit and the terminals of the first and second current conduction paths.

46. The differential current sensor of claim 43 wherein the first current conduction path is usable to carry a phase current and the second current conduction path is usable to carry a neutral current when the first and second current conduction paths are coupled to phase and neutral current conductors of a ground fault interrupter application.

47. The differential current sensor of claim 30, further comprising:
   a coil driver and interface logic to interface the circuitry to the coil driver, the interface logic to receive the difference signal from the circuitry and generate an input signal to the coil driver and the coil driver, in response to the input signal, to provide a drive signal to drive a coil of an external trip circuit.

48. The differential current sensor of claim 47 wherein the magnetic field sensing elements, the circuitry, the coil driver and the interface logic are integrated on a common substrate as an integrated circuit.

49. The differential current sensor of claim 28 further comprising a self-test circuit.

50. The differential current sensor of claim 28 wherein the first current is a phase current and the second current is a neutral current.

51. The differential current sensor of claim 28 wherein the magnetic field sensing elements and circuitry are integrated on a common substrate as an integrated circuit.

\* \* \* \* \*

UNITED STATES PATENT AND TRADEMARK OFFICE
CERTIFICATE OF CORRECTION

| | | |
|---|---|---|
| PATENT NO. | : 9,081,041 B2 | Page 1 of 1 |
| APPLICATION NO. | : 13/439094 | |
| DATED | : July 14, 2015 | |
| INVENTOR(S) | : Andreas P. Friedrich et al. | |

It is certified that error appears in the above-identified patent and that said Letters Patent is hereby corrected as shown below:

In the Specification

Column 3, line 39 delete "is top" and replace with --is a top--.

Column 3, line 52 delete "is block" and replace with --is a block--.

Column 3, line 57 delete "of example" and replace with --of an example--.

Column 6, line 54 delete "$B_{sE3}.$" and replace with --$B_{SE3}.$--.

Column 6, line 54 delete "$B_{sE3}$" and replace with --$B_{SE3}$--.

Column 7, line 23 delete "element" and replace with --elements--.

Column 7, line 48 delete "signal" and replace with --signals--.

Column 8, line 22 delete "elements" and replace with --element--.

Column 16, line 53 delete "(FIG.8BA)" and replace with --(FIG.8A)--.

Column 17, line 11 delete "FIG. 1A-1B" and replace with --FIGS. 1A-1B--.

In the Claims

Column 22, line 60 delete "fist" and replace with --first--.

Signed and Sealed this
Twenty-sixth Day of April, 2016

Michelle K. Lee
*Director of the United States Patent and Trademark Office*